(12) United States Patent
Minato et al.

(10) Patent No.: US 11,699,688 B2
(45) Date of Patent: Jul. 11, 2023

(54) SURFACE-EMITTING LIGHT SOURCE AND METHOD OF MANUFACTURING THE SAME

(71) Applicant: NICHIA CORPORATION, Anan (JP)

(72) Inventors: Eiko Minato, Anan (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 362 days.

(21) Appl. No.: 17/106,630

(22) Filed: Nov. 30, 2020

(65) Prior Publication Data

US 2021/0167046 A1 Jun. 3, 2021

(30) Foreign Application Priority Data

Dec. 3, 2019 (JP) .................................. 2019-219175
Jul. 6, 2020 (JP) .................................. 2020-116723

(51) Int. Cl.
| | |
|---|---|
| *H01L 25/075* | (2006.01) |
| *H01L 33/50* | (2010.01) |
| *H01L 33/60* | (2010.01) |
| *H01L 33/62* | (2010.01) |
| *H01L 33/58* | (2010.01) |

(52) U.S. Cl.
CPC .......... *H01L 25/0753* (2013.01); *H01L 33/50* (2013.01); *H01L 33/58* (2013.01); *H01L 33/60* (2013.01); *H01L 33/62* (2013.01); *H01L 2933/0066* (2013.01)

(58) Field of Classification Search
CPC ..... H01L 25/0753; H01L 33/50; H01L 33/58; H01L 33/60; H01L 33/62; H01L 2933/0066; H01L 33/54
See application file for complete search history.

(56) References Cited

U.S. PATENT DOCUMENTS

| 10,917,974 B2 * | 2/2021 | Tsuyutani ................ H05K 3/42 |
| 2002/0076903 A1 | 6/2002 | Kondo et al. |
| 2005/0155792 A1 | 7/2005 | Ito et al. |

(Continued)

FOREIGN PATENT DOCUMENTS

| JP | 2003-086948 A | 3/2003 |
| JP | 2003-258431 A | 9/2003 |

(Continued)

*Primary Examiner* — Victor A Mandala
(74) *Attorney, Agent, or Firm* — Squire Patton Boggs (US) LLP

(57) ABSTRACT

A surface-emitting light source includes: light-emitting modules; a wiring substrate including a base member having a surface at a light-emitting modules side and a rear surface opposite to that, a wiring layer on the rear surface of the base member and including wiring pads being portions of the wiring layer, electrically-conductive members each supplied across corresponding two or more of a plurality of vias in each of the wiring pads, and a covering layer covering the wiring layer and defining openings in each of which a portion of a corresponding one of the wiring pads is exposed; and an adhesive layer between the light-emitting modules and the wiring substrate. Each light-emitting module has an array of light emitting devices. The covering layer defines the openings at locations corresponding to the wiring pads with an area dimension smaller than respective area dimensions of the wiring pads.

20 Claims, 20 Drawing Sheets

(56) References Cited

U.S. PATENT DOCUMENTS

| | | | |
|---|---|---|---|
| 2010/0078655 A1* | 4/2010 | Yang | H01L 24/19 |
| | | | 257/E33.056 |
| 2013/0005210 A1* | 1/2013 | Takeda | H01L 24/97 |
| | | | 445/23 |
| 2015/0349223 A1* | 12/2015 | Lee | H01L 33/642 |
| | | | 257/99 |
| 2016/0284678 A1* | 9/2016 | Kobayakawa | H01L 25/167 |
| 2017/0171974 A1 | 6/2017 | Takahashi et al. | |
| 2018/0261732 A1* | 9/2018 | Richter | H01L 33/647 |
| 2019/0049649 A1 | 2/2019 | Hayashi et al. | |
| 2020/0251638 A1* | 8/2020 | Morris | H01L 27/1255 |
| 2021/0367124 A1* | 11/2021 | Cha | H01L 33/62 |
| 2022/0293670 A1* | 9/2022 | Lee | H01L 33/62 |
| 2022/0359584 A1* | 11/2022 | Hamasaki | G01S 17/894 |

FOREIGN PATENT DOCUMENTS

| | | |
|---|---|---|
| JP | 2003-318546 A | 11/2003 |
| JP | 2004-103716 A | 4/2004 |
| JP | 2006-237232 A | 9/2006 |
| JP | 2006-332280 A | 12/2006 |
| JP | 2012-169486 A | 9/2012 |
| JP | 2017-108034 A | 6/2017 |
| JP | 2018-166173 A | 10/2018 |
| JP | 2019-012681 A | 1/2019 |

\* cited by examiner

SURFACE-EMITTING LIGHT SOURCE AND METHOD OF MANUFACTURING THE SAME

CROSS-REFERENCE TO RELATED APPLICATIONS

This application claims priority to Japanese Patent Application No. 2019-219175, filed on Dec. 3, 2019, and Japanese Patent Application No. 2020-116723, filed on Jul. 6, 2020, the contents of which are hereby incorporated by reference in their entirety.

BACKGROUND OF THE INVENTION

1. Field of the Invention

The present disclosure relates to a surface-emitting light source and a method of manufacturing the same.

2. Description of Related Art

In a known method, electroless or electrolytic copper plating is performed in via holes in a base member to dispose via-conductors (for example, see Japanese Unexamined Patent Application Publication No. 2006-237232). When forming via-conductors inside the via-holes by plating, the plating is performed in a wet process, so that large-scale devices may be used and manufacturing steps may be complicated. Meanwhile, a dry-process technique is also known in which a wiring board and a light-emitting module are connected by pressing while heating.

SUMMARY

An object of certain embodiments according to the present disclosure is to provide a surface-emitting light source in which reliability of connection using a dry process can be increased and a method of manufacturing the same.

A surface-emitting light source according to one embodiment of the present disclosure includes a plurality of light-emitting modules; a wiring substrate including a base member having a surface at a light-emitting modules side and a rear surface opposite to the surface at the light-emitting modules side, a wiring layer disposed on the rear surface of the base member and including wiring pads which are portions of the wiring layer, electrically-conductive members each supplied across corresponding two or more of a plurality of vias, the plurality of vias formed in each of the wiring pads, and a covering layer covering the wiring layer and defining openings in each of which a portion of a corresponding one of the wiring pads is exposed; and an adhesive layer between the plurality of light-emitting modules and the wiring substrate. Each of the light-emitting modules has an array of a plurality of light emitting devices. The covering layer defines the openings at locations corresponding to the wiring pads with an area dimension smaller than respective area dimensions of the wiring pads.

A surface-emitting light source according to another embodiment of the present disclosure includes: a plurality of light-emitting modules; a wiring substrate including a base member having a surface at a light-emitting modules side and a rear surface opposite to the surface at the light-emitting modules side, a wiring layer disposed on the rear surface of the base member and including wiring pads as portions of the wiring layer, electrically-conductive members each supplied into a respective one of vias each formed in a corresponding one of the wiring pads, and a covering layer covering the wiring layer and defining openings in each of which a portion of a corresponding one of the wiring pads is exposed; and an adhesive layer between the wiring substrate and the plurality of light-emitting modules. Each of the light-emitting modules has an array of a plurality of light emitting devices. The covering layer defines the openings at locations corresponding to the wiring pads with an area dimension smaller than respective area dimensions of the wiring pads.

A method of manufacturing a surface-emitting light source according to still another embodiment of the present disclosure includes: providing a wiring substrate, the wiring substrate including a base member having a front surface and a rear surface opposite to the front surface, a wiring layer disposed on the rear surface of the base member and including wiring pads which are portions of the wiring layer, and a covering layer covering the wiring layer to define openings in each of which a portion of a corresponding one of the wiring pads is exposed, such that the covering layer defines the openings at locations corresponding to the wiring pads with an area dimension smaller than respective area dimensions of the wiring pads in a plan view; disposing an adhesive layer on a front surface side of the base member and forming through-holes in the wiring pad through the opening to extend through the wiring substrate and the adhesive layer; temporarily connecting a plurality of light emitting modules each having an array of a plurality of light emitting devices to the front surface side of the base member, covering openings of the plurality of through holes formed in the front surface side of the base member by the plurality of light emitting devices, creating a plurality of vias from the plurality of through holes; supplying an electrically-conductive material into the vias; and pressing and heating to obtain an electrically-conductive member and to bond the wiring substrate and the light-emitting modules through the adhesive layer.

Certain embodiments according to the present disclosure allows for providing a wiring substrate having higher reliability of connection.

DETAILED DESCRIPTION OF EMBODIMENTS

Figure 1:
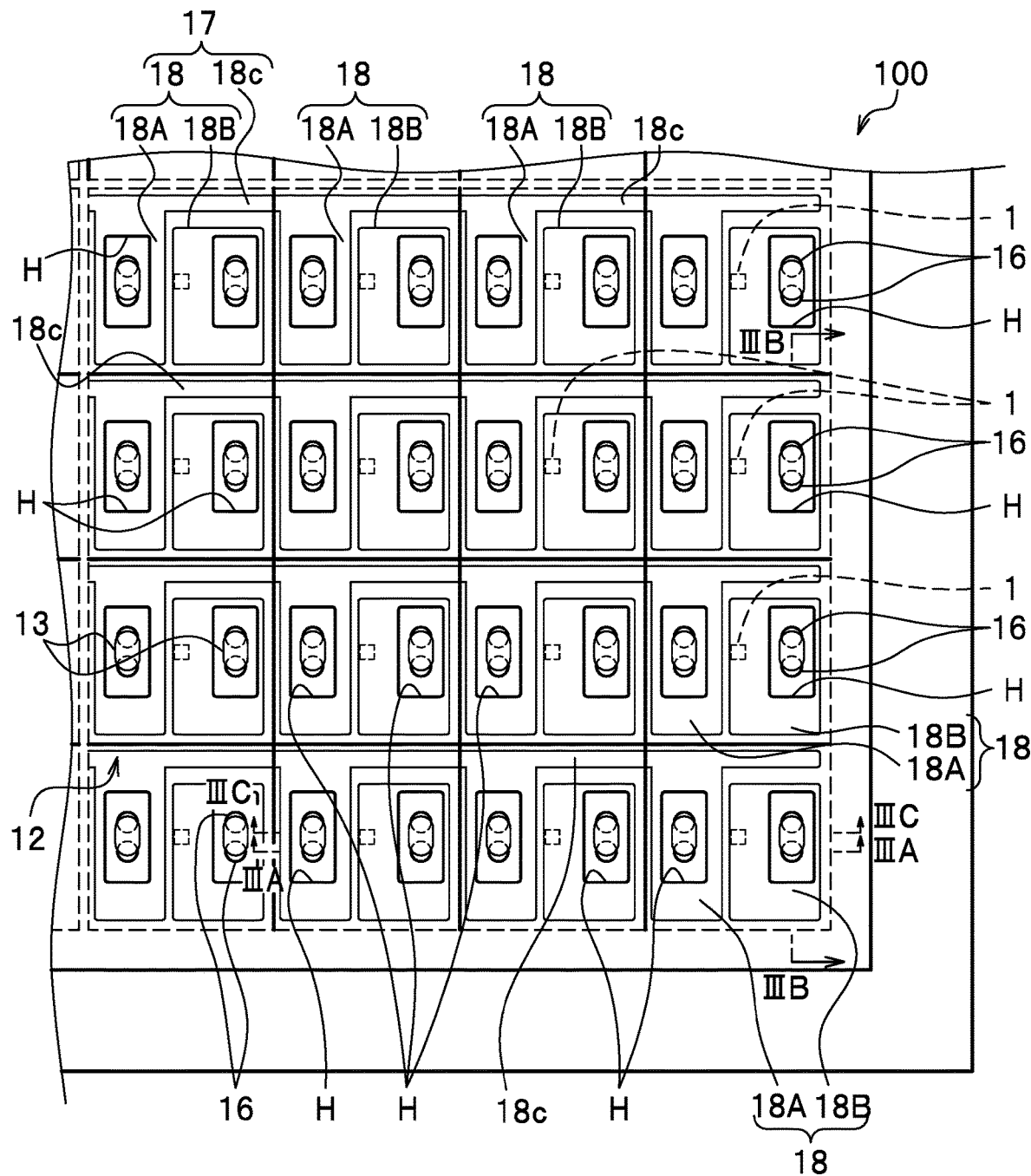
FIG. 1 is a schematic enlarged view illustrating a portion of a surface-emitting light source according to one embodiment viewed from a rear surface side of a wiring substrate.
Figure 2:
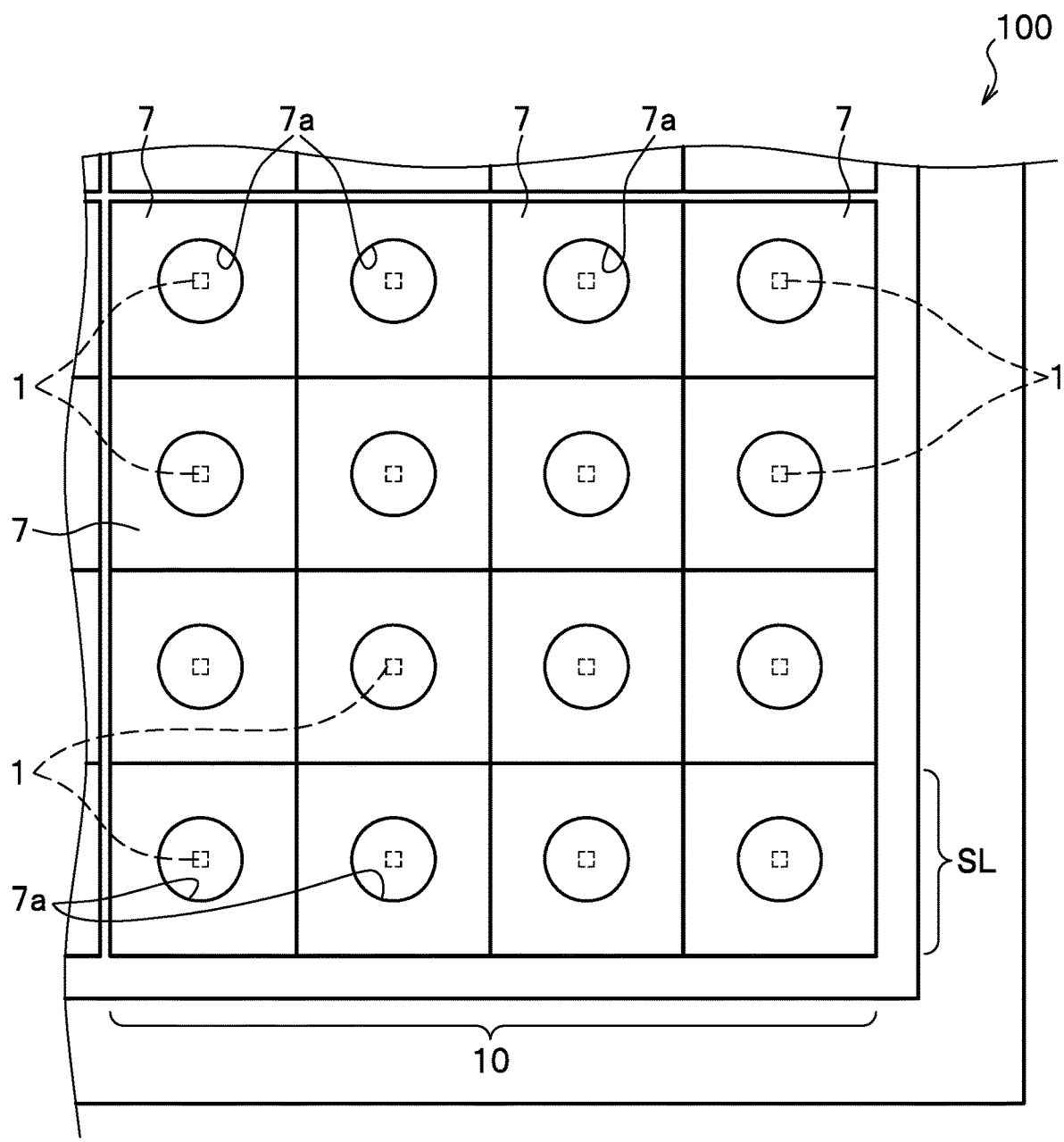
FIG. 2 is a schematic plan view of light-emitting modules of the surface-emitting light source according to one embodiment.
Figure 3A:
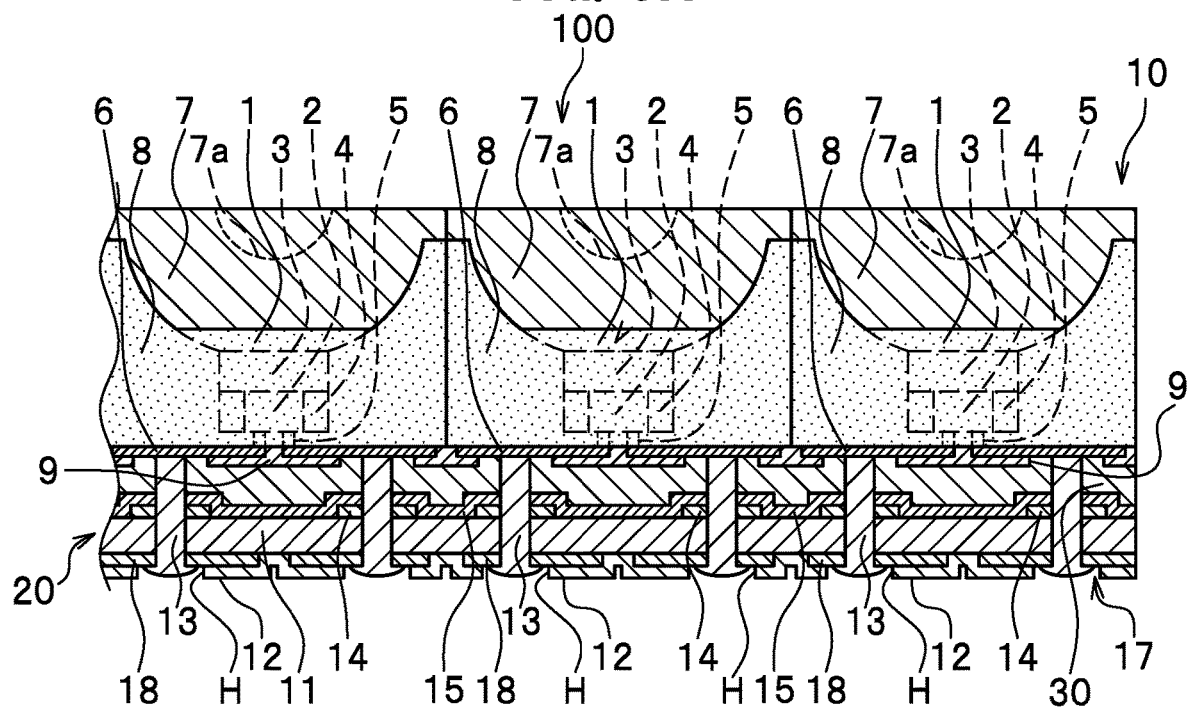
FIG. 3A is a schematic cross-sectional view taken along a line IIIA-IIIA of FIG. 1.
Figure 3B:
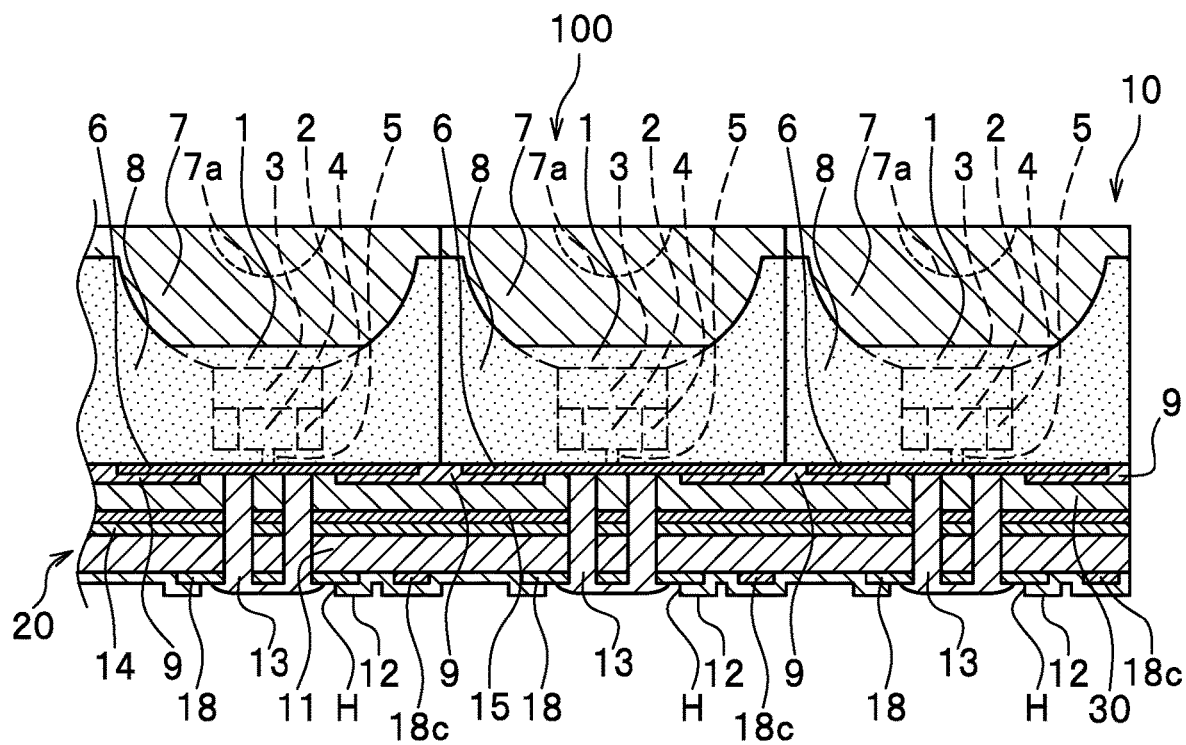
FIG. 3B is a schematic cross-sectional view taken along a line IIIB-IIIB of FIG. 1.
Figure 3C:
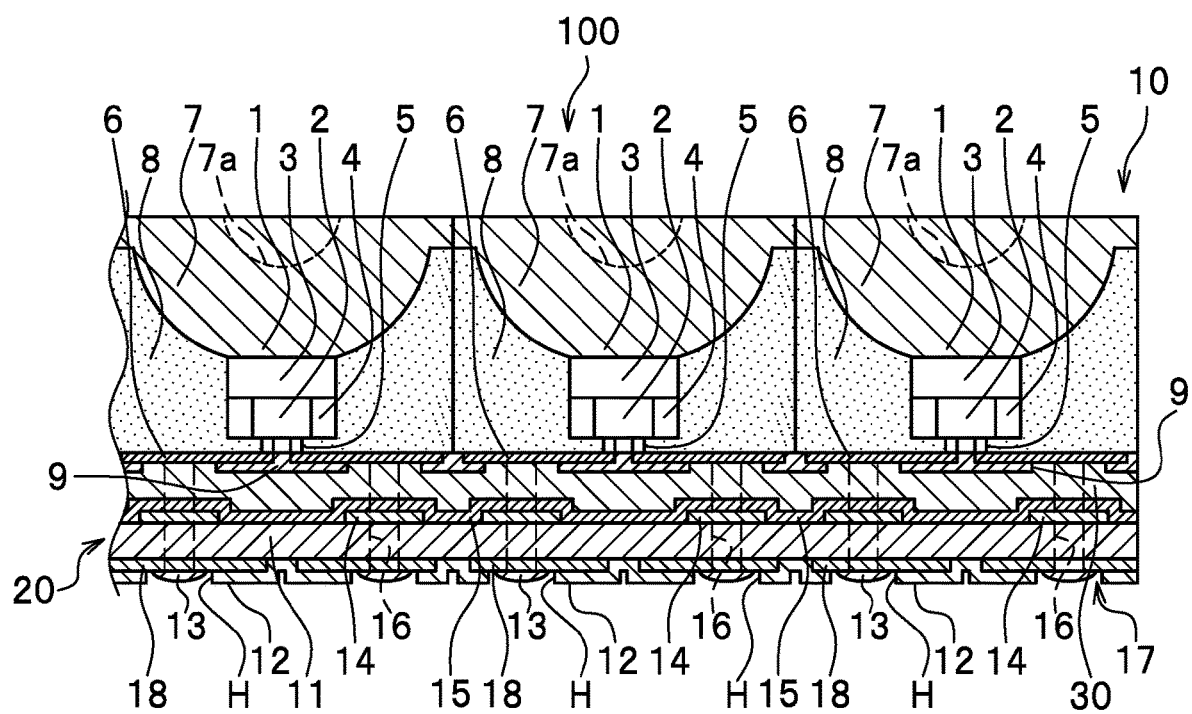
FIG. 3C is a schematic cross-sectional view taken along a line IIIC-IIIC of FIG. 1.

Drawings referred to in the descriptions below schematically illustrate certain embodiments of the present disclosure.

Scales, distances, positional relationships, and the like of members may be exaggerated, or illustration of some members may be omitted. Scales of members and distances between members are not necessarily the same. In the descriptions below, the same terms or reference numerals generally represent the same member or a member made of the same or similar material, and its detailed description may be appropriately omitted. In a configuration of a wiring substrate, the directions indicated by terms "upper", "lower", "left", and "right" are interchangeable in accordance with the circumstances. In the present specification, the terms "upper", "lower", etc., are intended to represent a relative position between the components in the drawing that is referenced for description, but is not intended to represent an absolute position unless specifically stated otherwise.

Surface-Emitting Light Source

A surface-emitting light source 100 will be described referring to FIGS. 1 to 6.

The surface-emitting light source 100 includes a wiring substrate 20, a plurality of light-emitting modules 10, and an adhesive layer (an adhesive sheet) 30 disposed between the wiring substrate 20 and the plurality of light-emitting modules 10. The wiring substrate 20 includes a base member 11, a wiring layer (a first wiring layer) 17 disposed on a rear surface of the base member 11 opposite to a surface at a light-emitting modules 10 side, electrically-conductive members 13 each supplied across corresponding two or more vias 16 of a plurality of vias 16 each formed for a corresponding one of wiring pads 18, the wiring pads 18 being portions of the wiring layer (the first wiring layer) 17, a covering layer (a first covering layer) 12 covering the wiring layer (the first wiring layer) 17 and defining openings H in each of which a corresponding portion of a corresponding one of the wiring pads 18 is exposed, each of the openings H overlapping at least a portion of a corresponding one of the vias 16. Each of the light-emitting modules 10 has an array of a plurality of light emitting devises 1. The first covering layer 12 defines openings H at locations corresponding to the wiring pads 18 with an area dimension smaller than respective area dimensions of the wiring pads 18 in a plan view.

Configurations of the surface-emitting light source 100 will be described below.

Wiring Substrate

The wiring substrate 20 includes the base member 11 and the first wiring layer 17 disposed on the base member 11 and including the wiring pads 18 each defining corresponding two or more of the plurality of vias 16. The vias are through-holes formed in the wiring pads 18 and the base member 11. In the example herein, in the wiring substrate 20, the wiring layer (hereinafter may be referred to as the first wiring layer) 17, the covering layer (hereinafter may be referred to as the first covering layer) 12 covering the first wiring layer 17, and the electrically-conductive members 13 each supplied into corresponding ones of the vias 16 each formed in a corresponding one of the wiring pads 18, which are portions of the first wiring layer 17, are disposed at a rear surface side of the base member 11. Further, protective members 19 may be disposed to protect respective corresponding ones of the electrically-conductive members 13 as described below. In the wiring substrate 20, a wiring layer (hereinafter referred to as a second wiring layer) 14 and a covering layer (hereinafter referred to as a second covering layer) 15 covering the second wiring layer 14 are formed on a front surface side of the wiring substrate 20. The wiring substrate 20 includes the plurality of light-emitting modules 10 at the front surface side of the wiring substrate 20 through the adhesive layer 30.

A material having a low elasticity is used for the base member 11 of the wiring substrate 20. Examples of such a material include insulating resin materials such as phenolic resins, epoxy resins, polyimide resins, polyethylene terephthalate, polyethylene naphthalate, silicone resins, BT resins, and polyphthalamide. The base member 11 may have a structure in which a layer made of an insulating member is disposed on a surface of a metal member. A rigid substrate or a flexible substrate can be used for the base member 11. The wiring substrate 20 may have a structure in which a plurality of base members 11 are layered. When a plurality of base members 11 are layered and vias are for respective corresponding ones of the layered base members, the vias in different layers of the layered base members may be formed at the same position or slightly different positions in a plan view.

The first wiring layer 17 is disposed on the rear surface of the base member 11 in a predetermined circuit pattern. The first wiring layer 17 includes the wiring pads 18 each of which has a rectangular shape, and narrow wirings 18c each connecting corresponding ones of the wiring pads 18. The wiring pads 18 includes positive wiring pads 18A and negative wiring pads 18B arrayed in a matrix of rows and columns at respective predetermined intervals. The wirings 18c that are connected to the positive wiring pads 18A are located at a predetermined distance from the positive wiring pads 18A of adjacent rows. Alternatively, the wirings 18c that are connected to the negative wiring pads 18B are located at a predetermined distance from the negative wiring pads 18B of adjacent rows. Increase of areas occupied by the wirings in the first wiring layer 17 allows for reducing unevenness in a thickness of the wiring substrate 20, so that adhesion of the wiring substrate 20 and the light-emitting modules 10 in a step S15 of pressing described below can be enhanced.

Each of the wiring pads 18 has a rectangular region with a width larger than the narrow wiring 18c. In the example herein, the positive wiring pads 18A have a rectangular shape of a predetermined size and are disposed at a predetermined interval from one side of the narrow wiring 18c. Each of the negative wiring pads 18B is disposed between adjacent ones of the positive wiring pads 18A at a predetermined interval to have a rectangular shape. That is, each positive wiring pad 18A is disposed adjacent to a corresponding one of the negative wiring pads 18B. In the example herein, a single positive wiring pad 18A and a single negative wiring pad 18B form a pair, and are connected to element electrodes of a single light emitting device 1. The wiring pad 18 has an area larger than the area dimension of vias 16 even in the case in which two or four vias 16 are formed.

The second wiring layer 14 is disposed on the front surface side of the base member 11. The second wiring layer 14 is provided together with the first wiring layer 17 to supply electric power to the light emitting device 1 from an external component. The second wiring layer 14 has a narrow-linear shape or a rectangular shape and is disposed on the front surface side of the base member 11 to have a predetermined circuit pattern. It is desirable that a portion of the second wiring layer 14 without the wirings does not overlap a portion of the first wiring layer 17 without the wirings. When the portion of the second wiring layer 14 without the wirings is formed at a position that does not overlap the portion of the first wiring layer 17 without the wirings, in a thickness direction of the wiring substrate 20, a metal material of the second wiring layer 14 and/or the first wiring layer 17 is disposed in a layering direction. This allows for reducing unevenness in the thickness of the wiring substrate 20 at the time of pressing the wiring substrate 20 together with the light-emitting modules 10 as described below, so that bonding state can be improved.

For the first wiring layer 17 and the second wiring layer 14, a metal material can be used, and for example, a single metal such as Ag, Al, Ni, Rh, Au, Cu, Ti, Pt, Pd, Mo, Cr, and W, or an alloy of these metals can be preferably used. A single metal having high light reflectivity such as Ag, Al, Pt, and Rh, or an alloy of these metals can be more preferably used.

In this example, two holes are formed in each wiring pad 18 and is continuous to holes in the base member 11 to create the vias 16. The vias 16 are created by covering through-holes 160 extending through the adhesive layer 30 and the base member 11, as described below. The vias 16 reaches a wiring layer 6 of the light-emitting module to be described below to form a hole formed with a bottom defined by the wiring layer 6 of the light-emitting module. The via 16 has a diameter of for example, 0.1 mm or more, more preferably 0.3 mm or more to reduce unevenness in connection resistance and to stabilize the luminance. Each of the vias 16 preferably has an aspect ratio of the diameter to the depth of 0.75 or less, more preferably 0.5 or less to easily supply the electrically-conductive member 13 into the via 16. Also, having a gap G01 of 0.1 mm or more and 0.3 mm or less between two vias 16 in each wiring pad 18 allows for reducing the connection resistance, and thus is preferable. The via 16 has an opening having a shape of, for example, a circular shape, an oval shape, a rectangular shape, a rhombus shape, a triangular shape, or a cross shape. One or more vias are formed in the wiring pads 18.

In the example herein, two vias each having an opening of a circular shape are formed in each wiring pad 18.

Each of the electrically-conductive members 13 is supplied into corresponding ones of the vias 16 to conduct electricity such that current from an external component is supplied to the arrayed light emitting devices 1. In the present embodiment, each electrically-conductive member 13 is supplied across two corresponding vias 16. Each of the wiring pads 18 may define a plurality of vias 16, and electrically-conductive members 13 may be respectively supplied into the plurality of vias 16. When each of the wiring pads 18 defines a plurality of vias 16, each electrically-conductive member 13 may be supplied across corresponding two or more vias 16 of the plurality of vias 16. The electrically-conductive members 13 are supplied from the rear surface side of the wiring substrate 20 into respective corresponding ones of the vias 16 such that each electrically-conductive member 13 is supplied across corresponding ones of the vias 16. That is, each electrically-conductive member 13 is supplied into two corresponding vias 16 of the plurality of vias 16, and is also disposed on a portion of a surface of a corresponding wiring pad 18 between the two corresponding vias 16. The expression "a portion of a surface of a corresponding wiring pad 18" as used herein refers to a portion of a peripheral part of the via 16. That is, each electrically-conductive member 13 is disposed to have a supplied portion that is supplied into two vias 16 and an intermediate portion that is disposed across the supplied portions on a portion of a surface of a corresponding wiring pad 18. The intermediate portion of each electrically-conductive member 13 has a predetermined thickness of, for example, equal to or smaller than a thickness of the first covering layer 12. While the supplied portion of the electrically-conductive member is preferably supplied into an entirety of corresponding vias 16, it is sufficient that the supplied portion of the electrically-conductive member is disposed in the corresponding vias 16 at least at an amount that allows for establishing electrical connection.

Examples of the electrically-conductive member 13 include a mixture of a filler such as flaky, scaly, or barky silver or copper powder and a thermosetting binder resin can be used. For the electrically-conductive member 13, a material with as small a volume resistance as possible and small contents of the binder resin and a solvent component is preferably used. In one example, as will be described below in description of a method of manufacturing, the electrically-conductive members 13 are disposed by screen printing through opening holes of a mask such that each electrically-conductive member 13 has supplied portions that are supplied into two vias 16 and an intermediate portion that is disposed across the supplied portions on a portion of a surface of a corresponding wiring pad 18.

The protective members 19 made of an insulating resin and the like may be disposed to cover respective corresponding ones of electrically-conductive members 13. Each protective member 19 protects a corresponding wiring pad 18 and a corresponding electrically-conductive member 13. A phenyl silicone resin and a dimethyl silicone resin may be used for the protective members 19. The protective members 19 may contain a pigment to be an opaque protective member.

The first covering layer 12 has a predetermined thickness and covers a predetermined region to protect the first wiring layer 17 and the like on the wiring substrate 20. A resin that is the same as a resin used for the protective members 19 may be used for the first covering layer 12, or polyimide may be used as a base material of the first covering layer 12. The first covering layer 12 is disposed on the wiring pad 18 to form openings H each of which has an area smaller than the area of a corresponding wiring pad 18. Accordingly, a portion of the first covering layer 12 covers a portion of a corresponding one of the wiring pads 18 and a portion of the rest of the corresponding wiring pad 18 is exposed from the first covering layer 12 through a corresponding one of the openings H. In one example, the openings H of the first covering layer 12 has a rectangular shape. In a plan view, openings of two vias 16 are formed at an approximately center region inside each rectangular opening H of the first covering layer 12.

That is, each opening H has a size that allows a plurality of vias 16 in a corresponding wiring pad 18 to be exposed from a single opening H of the first covering layer 12. Each opening H has an opening periphery apart from opening peripheries of the vias 16. The opening H may be formed at a location corresponding to the wiring pad 18 at the center of the wiring pad 18 or along any of sides of the rectangular wiring pad 18 within the wiring pad 18. The opening H may have a bilaterally symmetric shape with respect to the center or the center line of corresponding vias 16 in a plan view. The opening H in an example herein is formed to have an elongated rectangular shape (a rectangular shape) such that the center line passing through the center of the rectangular shape substantially corresponds to a center line passing through the centers of the vias 16.

The adhesive layer 30 bonds the light-emitting modules 10 and the wiring substrate 20.

A low elasticity material is used for the adhesive layer 30. In particular, the light-emitting modules 10 contain different materials and physical properties, such as a light-emitting element 2, a light guide plate 7, and a light-reflective member 8. Accordingly, an adhesive layer having a low elasticity is a preferable component for connection with the wiring substrate 20. The adhesive layer 30 preferably has an elasticity lower than the elasticity of the base member 11.

In general, in a wiring substrate as described in Japanese Unexamined Patent Application Publication No. 2006-237232, the greater the number of coverlay openings formed in a coverlay, which is a covering layer to protect the wirings, the smaller the diameter of the coverlay openings. The coverlay opening of the wiring substrate to be used in the dry process has a size greater than a width of wirings. Accordingly, in the coverlay opening, height differences between the wiring and the base member surface of the wiring substrate and between the coverlay and the base member surface of the wiring substrate occur, which generates spaces. At the time of pressing, a predetermined pressure is not easily applied to such spaces inside the coverlay opening, and the smaller the coverlay opening is, the less easily the pressure is conveyed. Further, at the time of pressing the wiring substrate having an elasticity of 2 Gpa or more and 5 Gpa or less and light-emitting modules including a hard polycarbonates through a low-elastic adhesive sheet having an elasticity of 100 Mpa or more and 1 Gpa or less, the low-elastic adhesive sheet flows in a direction toward the space having a smaller pressure due to the height differences. Accordingly, a portion of insufficient adhesion may be generated between the adhesive layer and the light-emitting modules. In the portion of insufficient adhesion, an air gap may be generated due to thermal expansion of a resin material. This may adversely affect the connection of vias, so that reliability of connection may be decreased.

On the other hand, the first covering layer 12 in the present embodiment defines the openings H of the present embodiment on or above the wiring pad 18.

Thus, height difference due to difference in the thicknesses of the first wiring layer 17 and the base member 11 in the thickness direction of the base member 11 does not occur around the wiring pad 18. Accordingly, when the base member 11 has an elasticity of 2 Gpa or more and 5 Gpa or less and the adhesive layer 30 has an elasticity of 100 Mpa or more and 1 Gpa or less, at the time of pressing the wiring substrate 20 and the light-emitting modules 10, unevenness in the thickness of the wiring substrate 20 can be reduced, which can improve bonding state. While a configuration in which a single opening H having a rectangular shape is formed for a plurality of vias 16 on a single wiring pad 18 is described above in one example, the openings H may have any appropriate shapes, and any appropriate number of the openings H may be formed. In another example of configuration as will be described below, the opening may be defined corresponding to the wiring pad 18 to partially overlap a portion of the vias 16 with an area dimension smaller than respective area dimensions of the wiring pad 18.

Light-Emitting Module, Light Emitting Device, Light-Emitting Element

As shown in FIGS. 1 to 6, each light emitting device 1 includes, for example, a light-emitting element 2, a light-transmissive member 3 disposed on a light-extracting surface side of the light-emitting element 2, a covering member (a white resin) 4 directly or indirectly disposed on lateral surfaces of the light-emitting element 2, a light guide plate 7 including an optical function portion 7a and disposed on the light-transmissive member 3, and a light-reflective member 8 covering a lower surface of the light guide plate 7, lateral surfaces of the light-transmissive member 3, and lateral surfaces of the covering member 4. The element electrodes 5 of the light-emitting element 2 in the light emitting device 1 are connected to the wiring layer 6 of the light-emitting module formed opposite to the light guide plate 7. When a single light emitting device 1 corresponds to a single cell SL (see FIG. 2), a plurality of cells are arrayed adjacently in the longitudinal and lateral directions to form the light-emitting module 10. The light-emitting module 10 is composed of, for example, 16 cells in a matrix of four by four cells. In the surface-emitting light source 100, for example, 76 light-emitting modules 10 are arrayed.

For the light-emitting element 2, a known semiconductor light-emitting element can be used, and for example, a light-emitting diode element may be used for the light-emitting element 2. A light source configured to emit blue light can be used for the light-emitting element 2. Alternatively, a plurality of light-emitting elements configured to emit different colors can be used to emit white light by mixing the lights of, for example, red, blue, and green colors. An element configured to emit light with any appropriate wavelength can be selected for the light-emitting element 2. The composition, emission color, size, number, and the like of the light-emitting elements to be used can be selected appropriately according to the purpose. Examples of elements configured to emit blue and green light include a light-emitting element including a nitride semiconductor ($In_XAl_YGa_{1-X-Y}N$, $0 \leq X$, $0 \leq Y$, $X+Y \leq 1$) or GaP. A light-emitting element containing a semiconductor such as GaAlAs or AlInGaP can be used for an element configured to emit red light. A semiconductor light-emitting element made of materials other than material described above can be used.

Various light emission wavelength can be selected by selecting various materials for the semiconductor layers and various mixing ratios of the materials.

The element electrodes 5 of the light-emitting element 2 are disposed at a side opposite to a side at which the light-transmissive member 3 is disposed, and are exposed from the lower surface of the covering member 4 to be described below. The element electrodes 5 include a negative electrode and a positive electrode disposed with a gap therebetween, and may be arranged diagonally or along two opposite sides of the light-emitting element 2 of a rectangular shape in a plan view.

The light-transmissive member 3 is made of a light-transmissive material containing a phosphor. A material having a higher refractive index than that of a material of the light-guiding plate 7 is preferably used for the light-transmissive material. Epoxy resins, silicone resins, mixtures of these resins, or glass and the like may be used. In view of resistance to light and ease of formation, silicone resins are preferably selected.

The range of wavelength into which a phosphor wavelength-converts varies according to types of phosphors.

An appropriate phosphor for the light-transmissive member 3 needs to be selected to convert into a desired wavelength. Examples of the phosphor include YAG phosphors, LAG phosphors, chlorosilicates phosphors, β-SiAlON phosphors, CASN phosphors, SCASN phosphors, and fluoride phosphors such as KSF phosphors. In particular, with a single light-transmissive member 3 containing a plurality of phosphors, more preferably, with the light-transmissive member 3 containing β-SiAlON phosphors adapted to emit green light and fluoride phosphors such as KSF phosphors adapted to emit red light, the color reproduction range of the light-emitting module can be expanded.

Further, with the light-transmissive member 3 containing a phosphor adapted to emit light having a predetermined color, light having a specific color can be emitted from the light-transmissive member 3. Quantum dots may be used for the light-transmissive member 3. The phosphor may be disposed in appropriate arrangement within the light-transmissive member 3. An effective arrangement of the phosphor, such as substantially even distribution, uneven distribution, and a layered structure having a plurality of layers each containing a different wavelength conversion material, can be selected.

The light-transmissive member 3 may include a diffusing member on the light-extracting surface side.

The covering member 4 is disposed directly on the lower surface of the light-transmissive member 3 and the lateral surfaces of the light-emitting element, or disposed on the lateral surfaces of the light-emitting element via the light-transmissive adhesive member. The covering member 4 may have a reflectance of 60% or more, preferably 90% or more, with respect to the light emitted from the light-emitting element 2. The covering member 4 has an outer periphery similar to the outer periphery of the light-transmissive member 3 in a plan view. The covering member 4 has a length between the lower surface of the light-transmissive member 3 (the upper surface of the covering member 4) and the lower surface of the covering member 4 that allows the element electrodes 5 to be exposed from the covering member 4.

The light guide plate 7 is a light-transmissive member on which light emitted from the light source is incident and from which light is surface-emitted. The light guide plate 7 may have the optical function portion 7a on a first main surface serving as the light-emitting surface, and may define a recess to accommodate the light-transmissive member 3 or the light emitting device 1 in a second main surface opposite to the first main surface. The light guide plate 7 may define a through-hole extending through the first main surface and the second main surface, the through-hole can accommodate the light-transmissive member 3 or the light emitting device 1. The light guide plate 7 may include a plurality of optical function portions 7a on the first main surface.

For the light guide plate 7, resin materials such as thermoplastic resins including acrylic resins, polycarbonates, cyclic polyolefins, polyethylene terephthalate, and polyesters, and thermosetting resins including epoxy resins and silicone resins, or a light-transmissive material such as glass can be used. In particular, thermoplastic resin materials can be efficiently manufactured using injection molding, and thus is preferably used. Among these materials, polycarbonates, which are highly transparent and inexpensive, are more preferable. When manufacturing the surface-emitting light source 100 in which the wiring layer 6 of the light-emitting module is formed after the light-emitting element 2 is mounted on the light guide plate 7, a step performed under high temperature such as solder reflow can be omitted. This allows for using a thermoplastic material with a low thermal resistance such as polycarbonates. The light guide plate 7 may be formed using, for example, an injection molding or a transfer molding.

The optical function portion 7a reflects light emitted from the light-emitting element 2 to spread the light outward in a radial direction to obtain uniform the emission intensity in a plane of the light guide plate 7. Various configurations, for example, a light-reflective or light-diffusing member, such as lenses, on the light guide plate 7 can serve as the optical function portion 7a. For example, the optical function portion 7a may have an interface with a substance, such as air, having a refractive index different from that of a material of the light guide plate 7. In the example herein, the optical function portion 7a is a recess having an inverted cone shape, and the size and the shape of the recess may be appropriately selected. More specifically, the optical function portion 7a may be a recess having a shape of an inverted polygonal pyramid such as an inverted quadrangular pyramid or an inverted hexagonal pyramid. The optical function portion 7a in the example herein is such a recess configured to reflect light irradiated to the interface between the substance having a refractive index different from that of a material of the light guide plate 7 and an inclined surface of the recess toward lateral directions of the light-emitting element 2, that is, in the radial direction with respect to the optical function portion 7a. The optical function portion 7a may have a structure in which, for example, a reflective film made of a metal or the like and a reflective material such as a white resin is disposed in the recess defined by an inclined surface having a linear or curved shape in a cross-sectional view. The optical function portion 7a is preferably formed such that optical axis of the light-emitting element 2 and the optical axis, which is the center of the optical function portion 7a (the deepest portion of the recess), of the optical function portion 7a substantially corresponds on the extended line.

The light-reflective member 8 protects the light-emitting element 2 and the light guide plate 7 and reflects light from the lateral surfaces of the light-emitting element 2 toward the light-emitting surface. The light-reflective member 8 is desired to have a reflectance of 60% or more, preferably 90% or more, of light emitted from the light-emitting element 2. The light-reflective member 8 made of a reflective material can efficiently guide the light emitted from the light-emitting element 2 to the light guide plate 7. With the light-reflective member 8 serving as both a member that protects the light-emitting element 2 and a reflective member disposed on a surface opposite to the emission surface of the light guide plate 7, a thickness of the light-emitting module 10 can be reduced.

A resin containing a white pigment and the like is preferably used for a material of the light-reflective member 8. A relatively large amount of a material is used for the light-reflective member 8 to cover a surface of the light guide plate 7. Accordingly, silicone resins containing titanium oxide, which is inexpensive, are preferably used for the light-reflective member 8 to reduce the cost of the light-emitting module 10.

In one example, the light-emitting element 2 and the light-transmissive member 3 are bonded through the light-transmissive adhesive member. When the light-transmissive adhesive member is disposed between the light-extracting surface of the light-emitting element 2 and the light-transmissive member 3, the light-transmissive adhesive member is preferably formed into fillets on lateral surfaces of the light-emitting element 2. For the light-transmissive adhesive member formed into fillets on the lateral surfaces of the light-emitting element 2, a known adhesive such as silicone resins and the like can be used.

The wiring layers 6 of the light-emitting module that are electrically connected to respective ones of the element electrodes 5 of the plurality of light-emitting elements 2 are disposed on the lower surface of the light-reflective member 8. The wiring layers 6 of the light-emitting module are formed on a surface facing the light-reflective member 8 and the element electrodes 5 of the light-emitting element 2. The wiring layers 6 of the light-emitting module are connected to the electrically-conductive members 13 in the vias 16 formed to extend through the wiring substrate 20 and the adhesive layer 30 from the rear surface of the wiring substrate 20. This allows the plurality of light emitting devices 1 to be electrically connected.

Figure 8A:
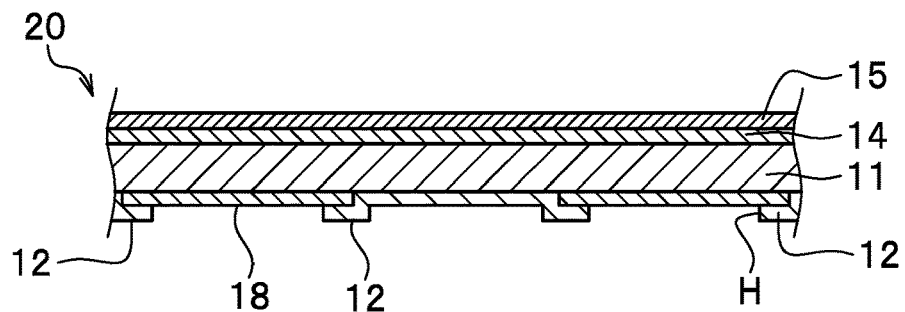
FIG. 8A is a schematic view illustrating a cross-section of a wiring substrate provided in a step of providing a wiring substrate in the method of manufacturing the surface-emitting light source according to one embodiment.
Figure 8B:
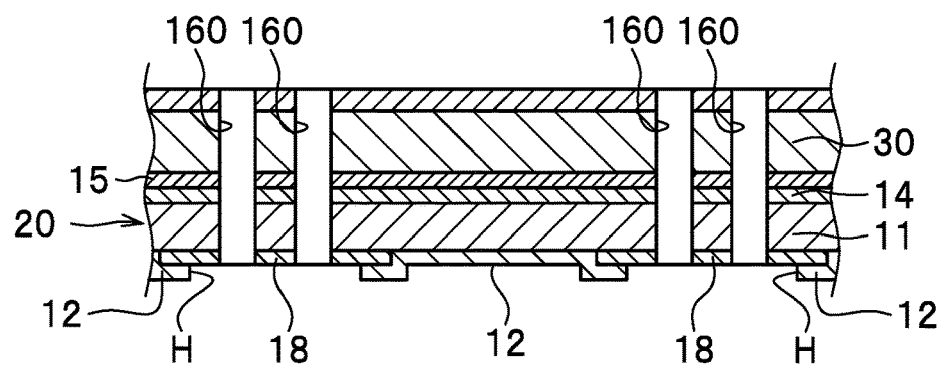
FIG. 8B is a schematic view illustrating a state in which the wiring substrate is bonded to an adhesive layer and through-holes are formed in a step of forming through-holes in the method of manufacturing the surface-emitting light source according to one embodiment.
Figure 8C:
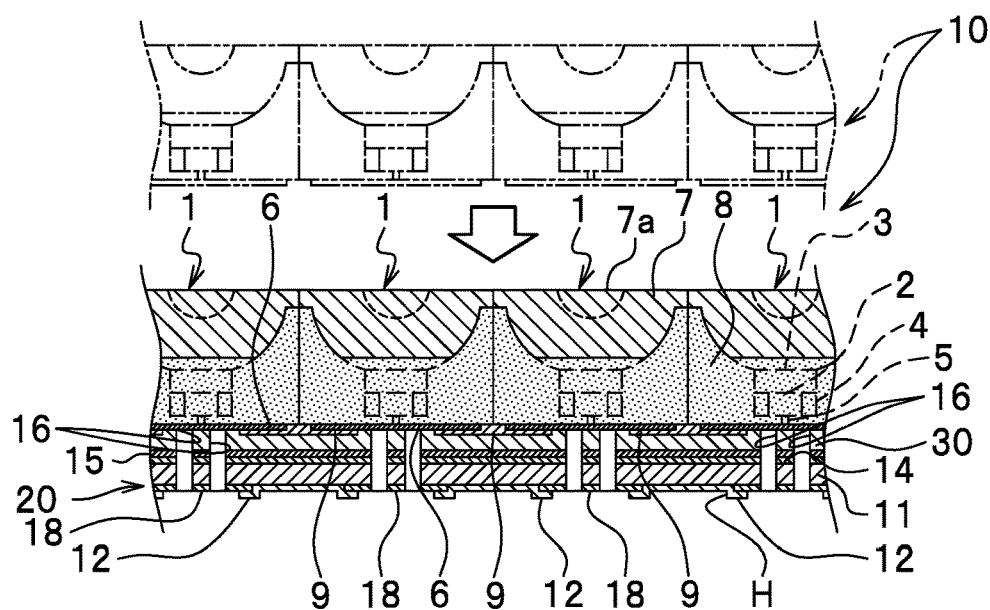
FIG. 8C is a schematic view illustrating a state in which vias are created in a step of creating vias in the method of manufacturing the surface-emitting light source according to one embodiment.
Figure 8D:
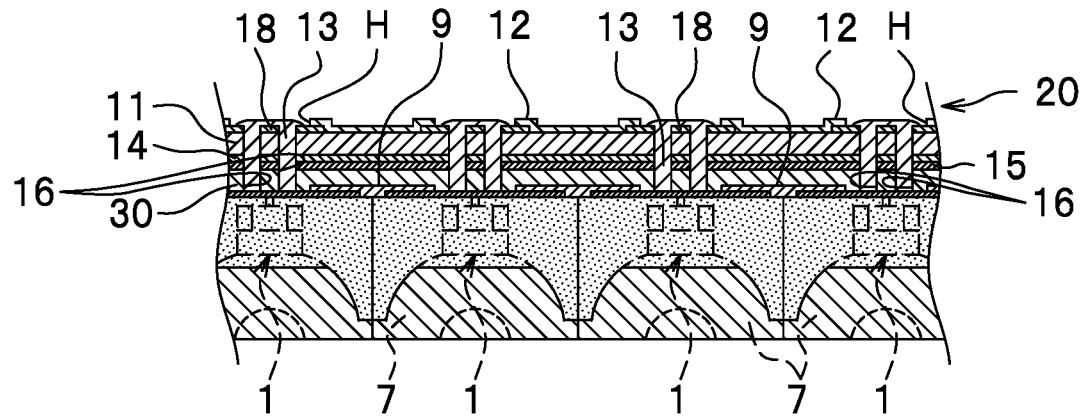
FIG. 8D is a schematic view illustrating a state in which an electrically-conductive material is supplied into the vias in a step of supplying in the method of manufacturing the surface-emitting light source according to one embodiment.
Figure 8E:
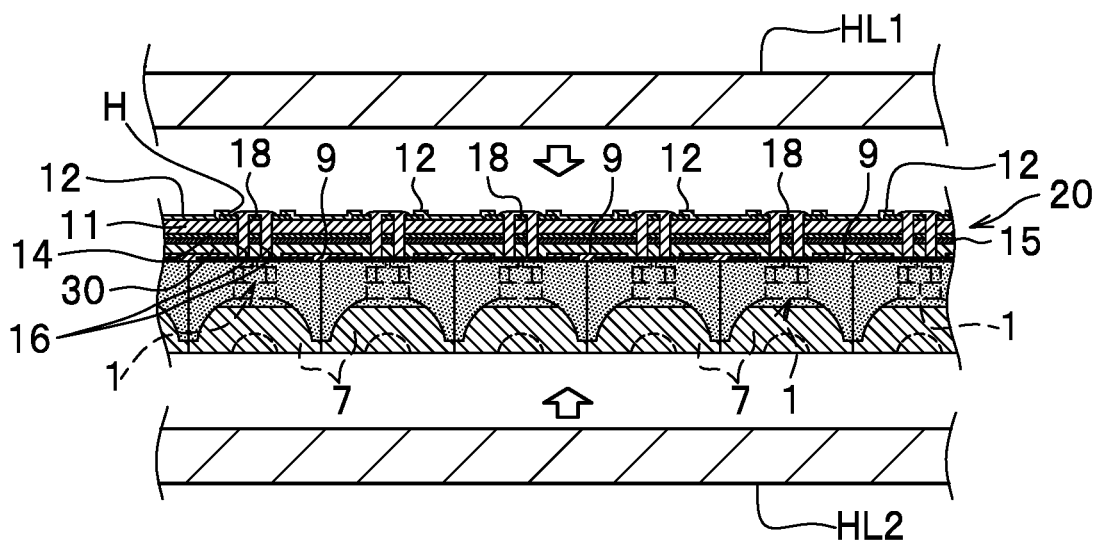
FIG. 8E is a schematic cross-sectional view illustrating a step of pressing in the method of manufacturing the surface-emitting light source according to one embodiment.
Figure 8F:
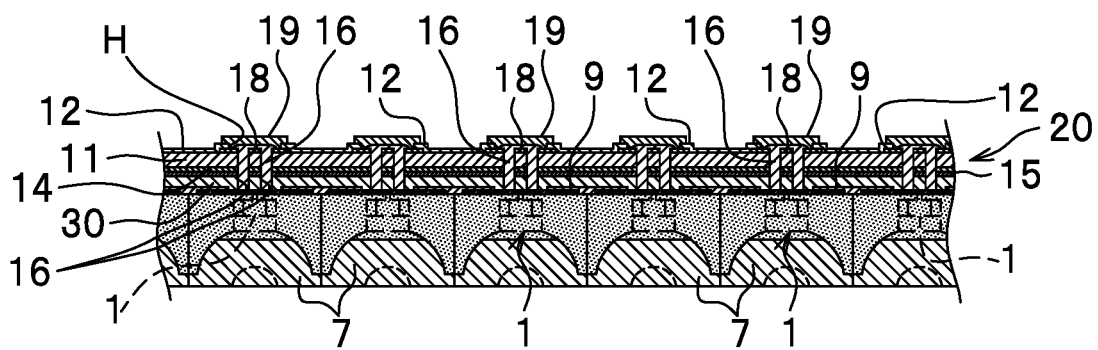
FIG. 8F is a schematic view illustrating a state in which a protective member is formed in a step of forming a protective member in the method of manufacturing the surface-emitting light source according to one embodiment.

A covering layer made of an insulating member 9 for the wiring layer 6 of the light-emitting module is preferably disposed at predetermined positions of the wiring layer 6 of the light-emitting module having the same configuration as the first covering layer 12. The insulating member 9 is n a form of a film defining an opening over the wiring layer 6 of the light-emitting module at a region in contact with the through-hole 160 (see FIG. 8B) of the wiring substrate 20. The light-emitting modules 10 are bonded to the wiring substrate 20 through the adhesive layer 30, so that the surface-emitting light source 100 is obtained. The adhesive layer 30 used in the example herein bonds the light-emitting modules 10 and the wiring substrate 20, and is desirably made of a material having a low elasticity for reducing warpage of the surface-emitting light source 100 due to the difference of linear expansion coefficients between the light-emitting module 10 and the base member 11. It is desirable that a sheet-like resin material having a low elasticity such as an acrylic resin, a silicone resin, or a urethane resin is used for the adhesive layer 30. The elasticity of a material for the adhesive layer 30 is preferably 100 MPa or more and 1 GPa or less. Using such a material allows for ensuring adhesion between the light-emitting module 10 and the wiring substrate 20 and reducing warpage. The adhesive layer 30 needs to have a thickness that allows for absorbing the height differences generated due to presence of the first wiring layer 17 and/or the second wiring layer 14 on the wiring substrate 20. The adhesive layer 30 preferably has a thickness of two times or more, more preferably four times or more of a thickness of the first wiring layer 17 or the second wiring layer 14. For example, when a copper foil of 18 μm is used for the second wiring layer 14, the thickness of the adhesive layer 30 is preferably 36 μm or more, more preferably 72 μm or more. A material for the adhesive layer 30 preferably has a high frame resistance.

Next, a method of manufacturing the surface-emitting light source 100 will be described referring to FIG. 7 and FIGS. 8A to 8F.

A method of manufacturing a surface-emitting light source according to one embodiment of the present disclosure includes: a step S11 of providing a wiring substrate, a step S12 of forming through-holes, a step S13 of creating vias, a step S14 of supplying, and a step S15 of pressing. In the step S11 of providing a wiring substrate, a wiring substrate 20 is provided, the wiring substrate 20 including a base member 11, a wiring layer (a first wiring layer 17) disposed on a rear surface of the base member 11, wiring pads 18 each of which is a portion of the first wiring layer 17, and a first covering layer 12 covering the first wiring layer 17 and defining openings H from each of which a portion of a corresponding one of the wiring pads 18 is exposed, each of the openings H having a size smaller than an area of the wiring pad 18 in a plan view. In the step S12 of forming through-holes, an adhesive layer 30 is disposed on a front surface side of the base member 11 and through-holes are formed on a corresponding one of the wiring pads 18 through the opening H such that the through-holes extend through the wiring substrate 20 and the adhesive layer 30. In the step S13 of creating vias, a plurality of light emitting modules 10 each having an array of a plurality of light emitting devices 1 are temporarily connected to the front surface side of the base member 11, such that openings of the plurality of through holes 160 formed in the front surface side of the base member 11 are covered by the plurality of light emitting devices 1, such that a plurality of vias 16 are created from the plurality of through holes 160. In the step S14 of supplying, the electrically-conductive material 13 is supplied into respective corresponding ones of the vias 16. In the step S15 of pressing, the wiring substrate 20 and light-emitting modules 10 are pressed and heated to be bonded using the adhesive layer 30.

In the step S11 of providing a wiring substrate, the wiring substrate 20 having the first wiring layer 17 and the first covering layer 12 on the rear surface of the base member 11 is provided. In the step of providing a wiring substrate, the wiring pads 18 that are portions of the predetermined wiring pattern disposed on the rear surface of the base member 11, and narrow wirings 18c each connected to corresponding ones of the wiring pads 18 are disposed. The wiring pads 18 are arranged such that a positive wiring pad 18A and a negative wiring pad 18B are alternately disposed at predetermined intervals along a straight line and arrayed in a matrix direction. In the first wiring layer 17, for example, a circuit pattern is formed from a metal layer made of a copper foil. In the case of forming the circuit pattern on the rear surface or the front surface of the base member 11, for example, the circuit pattern may be a layered structure of metal layers. Examples of a method of forming the metal layers include directly depositing the wiring pads 18 and the narrow wirings 18c to form a predetermined wiring pattern using a plating technique or vapor phase film forming techniques (sputtering, ion plating, electron beam evaporation, vacuum deposition, chemical vapor deposition, and the like). In terms of cost and productivity, it is advantageous that the metal layer is bonded to the front surface of the base member 11 by a urethane adhesive. In the step S11 of providing a wiring substrate, the second wiring layer 14 may be disposed on the front surface of the base member 11 as well as the first wiring layer 17.

Next, the first covering layer 12 is disposed on the base member 11 including a first wiring layer 17 such that the first covering layer 12 defines the openings H at locations corresponding to the wiring pads 18, which are portions of the first wiring layer 17. The first covering layer 12 can be disposed, for example, using a printing technique such as screen printing, and other known technique according to the employed material for the covering layer. The first covering layer 12 is disposed on the wiring pads 18 by screen printing using a mask and the like such that the wiring pads 18 are partially exposed through the openings H. The openings H has an area dimension smaller than the area dimensions of respective wiring pads 18, and each opening H has a size that allows the plurality of vias 16 for each wiring pad 18 to be exposed in a single opening H of the first covering layer 12. In the case of forming the second wiring layer 14, a second covering layer 15 is disposed to cover the second wiring layer 14 at predetermined positions using a technique as described above.

Next, the step S12 of forming through-holes is performed. In the step S12 of forming through-holes, the adhesive sheet serving as the adhesive layer 30 is bonded to the front surface side of the provided wiring substrate 20. At this time, in an example herein, the adhesive sheet having adhesive surfaces on two opposite sides and provided with a separator (a releasing paper) at a front surface of the adhesive sheet is used, the adhesive sheet configured such that the adhesive surface appears by removing the separator. In the step S12 of forming through-holes, the through-holes 160 are formed through the openings H for respective wiring pads 18 to extend through the wiring substrate 20 and the adhesive layer 30. The through-holes 160 are formed through the opening H of the first covering layer 12 to extend through the wiring substrate 20 and the adhesive layer 30 by drilling, punching, or the like. A plurality of the through-holes 160 (in the example herein, two through-holes 160) are formed within the area of the wiring pad 18 in a plan view.

Next, the step S13 of creating vias is performed. In the step S13 of creating vias, the separator (the releasing paper) of the adhesive layer 30 on the other surface to be bonded to the wiring substrate 20 is removed, and the plurality of light-emitting modules 10 are temporarily connected to the other surface of the adhesive layer. The expression "connect" as used in the present embodiment includes not only electrically connecting but also joining the wiring substrate 20 and the light-emitting module 10". The light-emitting module 10 is configured such that the wiring layer 6 of the light-emitting module is exposed from the insulating member 9 at predetermined positions at the lower surface side of the light-emitting module 10. In the step S13 of creating vias, the wiring substrate 20 and the light-emitting module 10 are temporarily connected through the adhesive layer 30 such that, in the light-emitting module 10, the wiring layer 6 of the light-emitting module faces the openings of the through-holes 160 formed in the wiring substrate 20 at the front surface side of the light-emitting module 10. In the step S13 of creating vias, the light-emitting module 10 is temporarily connected to the front surface side of the wiring substrate 20 through the adhesive layer 30 to cover one end of each of the through-holes 160, so that vias 16 are created.

In one example, the light-emitting module 10 used in the step S13 of creating vias is provided by manufacturing steps described below. A light guide plate 7 having provided with the optical function portion 7a and defining a recess to accommodate the light-transmissive member 3 is provided.

Next, the light-transmissive member 3 is disposed in the recess of the light guide plate 7, and the light-extracting surface of the light-emitting element 2 is bonded to the light-transmissive member 3 using an adhesive such as a resin. Further, after forming the light-reflective member 8, the wiring layer 6 of the light-emitting module to which the element electrodes 5 of the light-emitting element 2 are to be connected is formed. The light-emitting module 10 is provided by forming the insulating member 9 made of a protective insulating member is disposed on predetermined portions of the lower surface of the wiring layer 6 of the light-emitting module and the lower surface of the light-reflective member 8.

In the step S13 of creating vias, the wiring layer 6 of the light-emitting module faces the through-holes 160 extending through the wiring substrate 20 and the adhesive layer 30 to create vias 16 from the through-holes 160 by temporarily connecting each of the plurality of light-emitting modules 10 to the wiring substrate 20 through the adhesive layer 30.

Next, the step S14 of supplying is performed. In the step S14 of supplying, an electrically-conductive material 13 such as electroconductive paste is supplied into the vias 16. In the step S14 of supplying, the electrically-conductive material 13 is supplied into the vias 16 such that the electrically-conductive material 13 is filled in the vias 16 and further on a portion of a surface of the wiring pad 18, connecting respective adjacent two vias 16. In the step S14 of supplying, for example, a mask defining a plurality of openings is used. In one example, the plurality of openings of the mask are formed in an elongated circular shape corresponding to a shape surrounding the openings of the two vias 16. In the present embodiment, the elongated circular shape refers to a ring shape having a major axis, a minor axis, and at least two curved lines. Each opening in the mask is formed and disposed for a respective one of the wiring pads 18. When applying the electroconductive paste by moving a squeegee in an operation of printing such as screen printing, the electrically-conductive material 13 is supplied into the vias 16 through openings of the mask, and is disposed on portions of surfaces of wiring pads 18. The electrically-conductive member 13 is printed to form the supplied portion supplied into the vias 16 and the intermediate portion disposed on a portion of a surface of the wiring pad 18. In screen printing, the squeegee may be moved once, or may be reciprocated one or more times.

Next, the step S15 of pressing is performed. In the step S15 of pressing, the electrically-conductive material 13 is hardened to obtain electrically-conductive members 13, and the wiring substrate 20 and the light-emitting module 10 are connected through the adhesive layer 30. In the step S15 of pressing, hardening may also be performed with reducing of a thickness of the intermediate portion of the electrically-conductive member 13 to be smaller than a thickness of the intermediate portion when the electrically-conductive member 13 is disposed through the opening of the mask. In the step S15 of pressing, for example, using upper and lower heating platens HL1 and HL2 temperature of which can be controlled, pressing is performed during heating. Pressing may be performed with release films attached to the heating platens HL1 and HL2. In the step S15 of pressing, pressing is performed with the heating platens HL1 and HL2 heated at a predetermined temperature. This hardens the adhesive surface of the adhesive layer 30, so that the wiring substrate 20 and the light-emitting module 10 are connected through the adhesive layer 30.

In the step S15 of pressing, when the upper and lower heating platens HL1 and HL2 press the wiring substrate 20, the base member 11 is not exposed outward in a peripheral region of the wiring pad 18.

With this structure, the opening H does not form a gap defined by the base member 11 and the first covering layer 12. That is, the first covering layer 12 defines openings H at locations corresponding to the wiring pads 18 with an area dimension smaller than respective area dimensions of the wiring pads 18 in a plan view. With this structure, when a portion of the first covering layer 12 at the opening H is pressed using the heating platens HL1 and HL2, the wiring pad 18 is pressed through the first covering layer 12. Accordingly, in the wiring substrate and the light-emitting module 10, no portion is pressed through a gap as in a conventional case. This allows for pressing at an appropriate pressure inside the opening H, so that the wiring substrate 20 and the light-emitting module 10 can be connected together on the respective sides of the adhesive layer 30 without air gaps.

Subsequently to the step S15 of pressing, a step S16 of disposing protective members may be performed. In the step S16 of forming protective members, protective members 19 made of an insulating resin are disposed over the electrically-conductive member 13 that is pressed in the step S15 of pressing. In the step S16 of forming protective members, the protective member 19 made of an insulating resin is supplied from a surface side of the base member 11 so as to cover the wiring pad 18 to be pressed. The protective members 19 have a greater height than the height of the first covering layer 12 to cover respective electrically-conductive members 13. When the electrically-conductive member 13 is supplied insufficiently to leave a gap inside the via 16, the protective member 19 is also supplied into the gap in the via 16.

As described above, in the surface-emitting light source 100, the first covering layer 12 defines openings H at locations corresponding to the wiring pads 18 with an area dimension smaller than respective area dimensions of the wiring pads 18 in a plan view. This allows the wiring substrate 20 and the light-emitting module 10 to be pressed through the adhesive layer 30 such that a predetermined pressure is applied to the whole surface. Accordingly, in the surface-emitting light source 100, insufficient adhesion can be prevented, which allows for reducing generation of an air gap at an interface between the adhesive layer 30 and the wiring layer 6 of the light-emitting module due to thermal expansion of a resin member, so that adverse effect to the connection through vias can be prevented, and accordingly reliability of connection can be increased. Also, in a manufacturing step of the surface-emitting light source 100, connecting portions of the wiring substrate 20, the adhesive layer 30, and the light-emitting module can be appropriately pressed, and a volatile component of the electrically-conductive member 13 can be released from the opening H, allowing for pressing more appropriately than in a conventional configuration. Further, in the surface-emitting light source 100 and the method of manufacturing the same, adhesion of the adhesive layer 30 can be increased and via-resistance can be reduced.

Any appropriate shapes, number, and the like of the openings H may be defines in the first covering layer 12 corresponding to wiring pads 18, and, for example, the opening H may be formed as shown in FIGS. 9A to 9D. First to fourth variations of the opening H for each wiring pad 18 will be described below. Also, while an example in which the opening of the via 16 has a circular shape is described above, the opening of the via 16 may have any appropriate shape such as a rectangular shape, an oval shape, a triangular shape, a cross shape, a hexagonal shape, or the like.

Figure 9A:
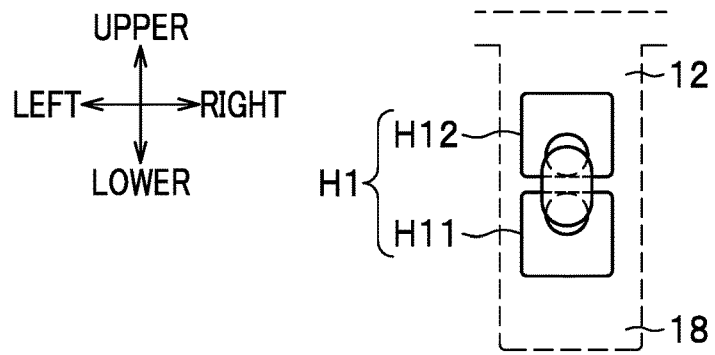
FIG. 9A is a schematic enlarged plan view of an opening of a first covering member in a first variation of the surface-emitting light source according to one embodiment.

As shown in FIG. 9A, openings H1 each corresponding to a respective one of two (a plurality of) vias 16 may be formed. The openings H1 include a first rectangular opening H11 facing one of the vias 16 and having a rectangular shape, and a second rectangular opening H12 facing the other of the vias 16 and having a rectangular shape, which are arranged vertically adjacent to each other through a portion of the first covering layer 12 in a plan view. The first rectangular opening H11 has a shape in which a portion of a periphery of an opening of a corresponding via 16 meet an upper end side of the rectangular shape in a plan view. The second rectangular opening H12 has a shape in which a portion of a periphery of an opening of a corresponding via 16 meet a lower end side of the rectangular shape facing the first rectangular opening H11.

The first rectangular opening H11 and the second rectangular opening H12 are formed adjacent to each other in respective single vias 16 such that a portion of each of the first and second rectangular openings H11 and H12, which is a periphery of a portion of the first covering layer 12, meets a portion of a periphery of a respective one of the vias 16. The openings H1 have a bilaterally symmetric shape with respect to a line that connects the centers of the vias 16 vertically in a plan view. With a structure formed of the first rectangular opening H11 and the second rectangular opening H12, the openings H1 can correspond to the vias 16 disposed, for example, greatly spaced apart from each other on the wiring pad 18. In the openings H1, one of the vias 16 is located in the first rectangular opening H11 offset from the center of the first rectangular opening H11 toward one side, and the other via 16 is located in the second rectangular opening H12 offset from the center of the second rectangular opening H12 toward another side. The via 16 is located at the center of the first rectangular opening H11 or the second rectangular opening H12.

Figure 9B:
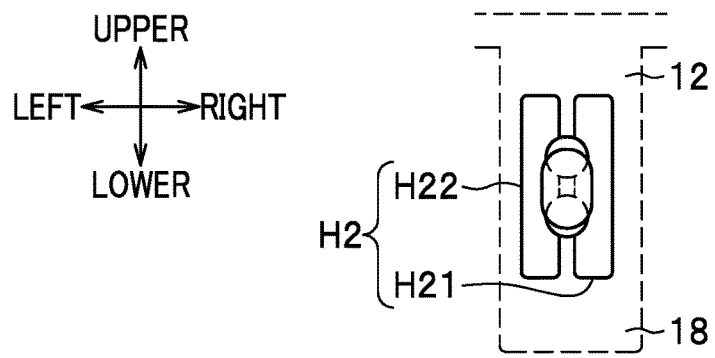
FIG. 9B is a schematic enlarged plan view of an opening of a first covering member in a second variation of the surface-emitting light source according to one embodiment.

As shown in FIG. 9B, openings H2 that include a first rectangular opening H21 and a second rectangular opening H22 having a rectangular shape and formed at a predetermined interval at a left side and a right side of the via 16 that are vertically aligned in a plan view may be formed. A portion of the first rectangular opening H21 is formed to overlap a portion of each of the plurality of vias 16 at one side (the right side) with respect to the centers of the vias 16. The second rectangular opening H22 is formed to overlap a portion of each of the plurality of vertically aligned vias 16 at another side (the left side) with respect to the centers of the vias 16. The first rectangular opening H21 and the second rectangular opening H22 are disposed adjacent to each other through a portion of the first covering layer 12 and a portion of the via 16. The openings H2 have a bilaterally symmetric shape with respect to the line that vertically connects the centers of the vias 16 in a plan view.

Figure 9C:
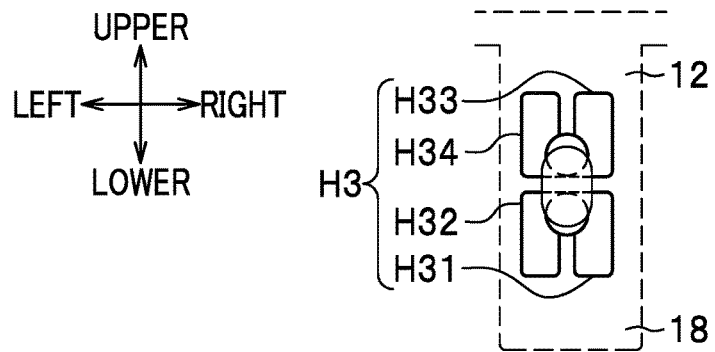
FIG. 9C is a schematic enlarged plan view of an opening of a first covering member in a third variation of the surface-emitting light source according to one embodiment.

As shown in FIG. 9C, openings H3 including a first rectangular opening H31, a second rectangular opening H32, a third rectangular opening H33, and a fourth rectangular opening H34 that are aligned vertically and laterally to the vertically aligned vias 16 in a plan view. In the openings H3, the first rectangular opening H31 and the second rectangular opening H32 are formed adjacent to each other to overlap a portion of one of the vias 16.

The third rectangular opening H33 and the fourth rectangular opening H34 are formed adjacent to each other to overlap a portion of another one of the vias 16. Further, in the rectangular openings H3, the first rectangular opening H31 and the third rectangular opening H33 are disposed adjacent to each other through a portion of the first covering layer 12, and the second rectangular opening H32 and the fourth rectangular opening H34 are disposed adjacent to each other through a portion of the first covering layer 12. In a plan view, the openings H3 have a bilaterally symmetric shape with respect to a line that vertically connects the centers of the vias 16, and also have vertically symmetric in the vertical direction.

Figure 9D:
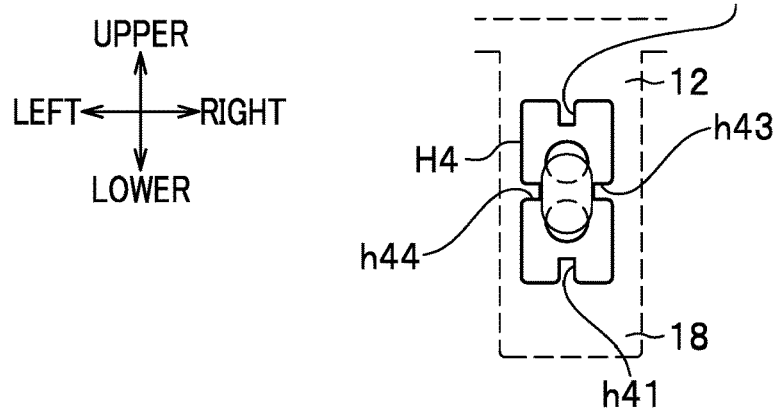
FIG. 9D is a schematic enlarged plan view of an opening of a first covering member in a fourth variation of the surface-emitting light source according to one embodiment.

As shown in FIG. 9D, a single opening H4 having a rectangular shape may be formed for a plurality of vias 16 and having protruding side portions h41, h42, h43, and h44 at upper, lower, left, and right parts of the rectangular opening to narrow the rectangular opening in a plan view. In the opening H4, the vias 16 are disposed at upper and lower sides with the left and right protruding portions h43 and h44 at the center. In a plan view, the opening H4 has a bilaterally symmetric shape with respect to a line that vertically connects the centers of the vias 16, and also has a vertically symmetric shape in the vertical direction.

In the surface-emitting light source 100 described above, the wiring substrate 20 includes the first wiring layer 17 and the first covering layer 12 on the rear surface of the base member 11, and the second wiring layer 14 and the second covering layer 15 on the front surface of the base member 11.

Figure 10:
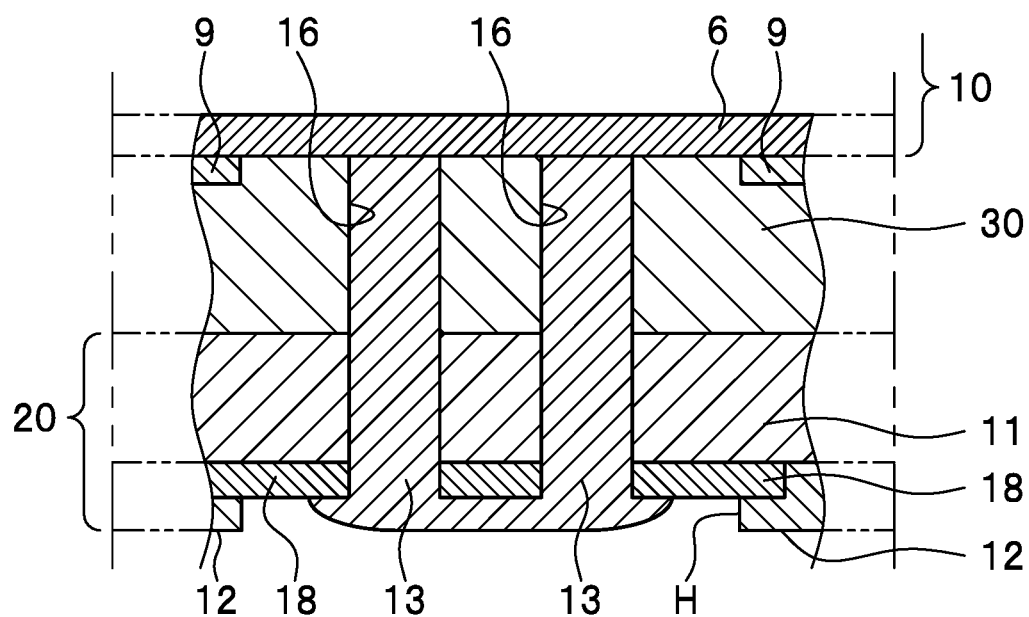
FIG. 10 is a schematic cross-sectional view illustrating another configuration of the wiring substrate in the surface-emitting light source according to one embodiment.

Meanwhile, as shown in FIG. 10, a wiring substrate including the first wiring layer 17 and the first covering layer 12 that are disposed on only the rear surface of the base member 11 may be used in the surface-emitting light source 100.

Figure 11A:
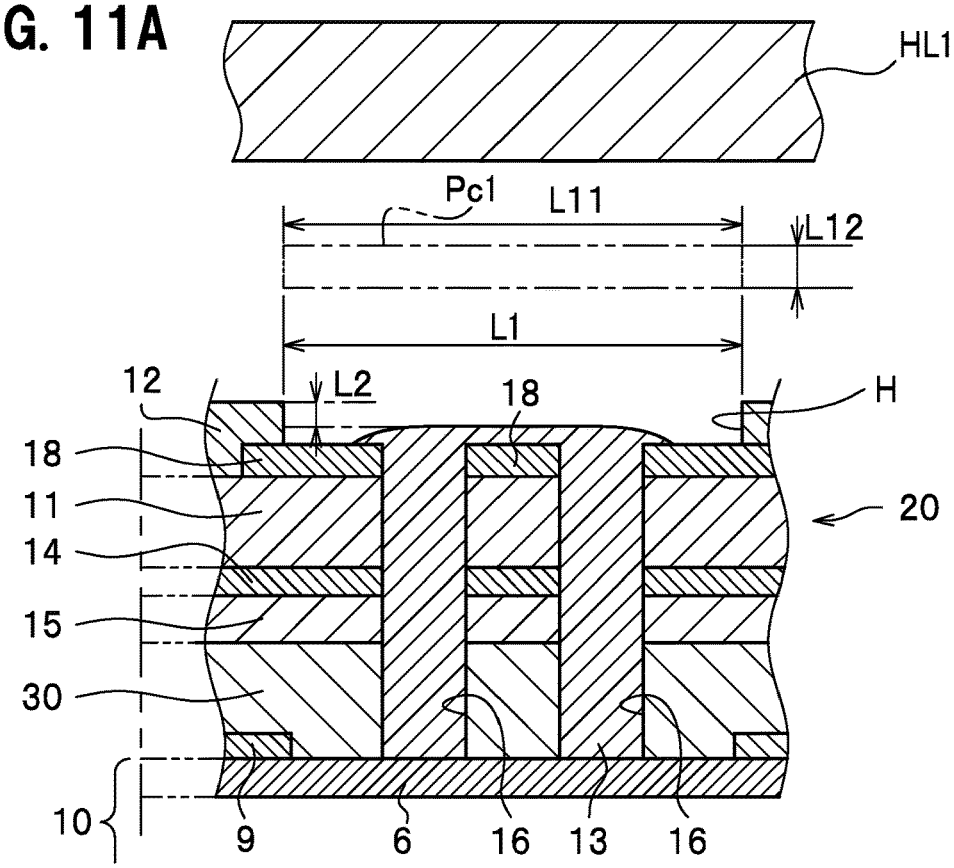
FIG. 11A is a schematic view illustrating a first variation of the step of pressing in the method of manufacturing the surface-emitting light source according to one embodiment.
Figure 11B:
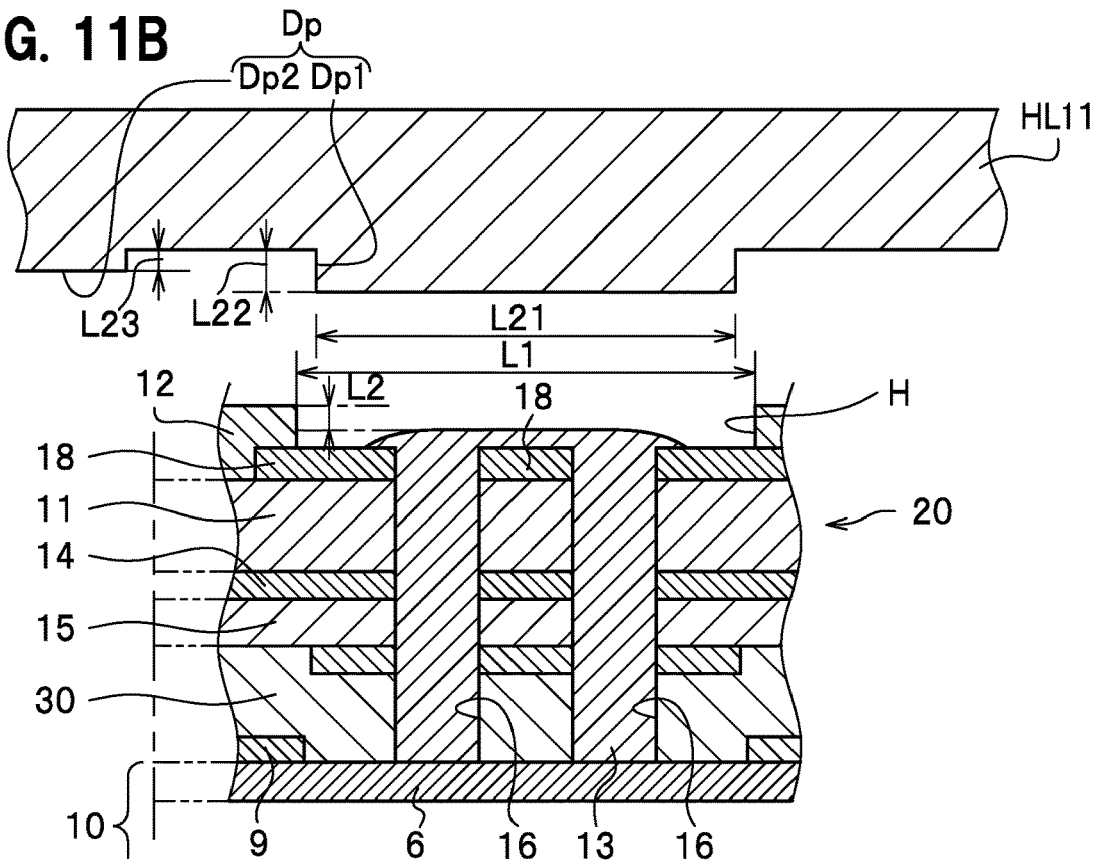
FIG. 11B is a schematic view illustrating a second variation of the step of pressing in the method of manufacturing the surface-emitting light source according to one embodiment.

In the method of manufacturing the surface-emitting light source 100, pressing may be performed as shown in FIGS. 11A and 11B.

As shown in FIG. 11A, in the step S15 of pressing, pressing may be performed using the heating platen HL1, which is a metal mold, through a sheet Pc1 having a length L11 and a thickness L12 that are similar to the length L1 and the hole depth L2, respectively, of the opening H in a plan view. The sheet Pc1 for use is preferably an absorptive sheet made of paper and the like adapted to absorb molten binder resin contained in the electrically-conductive member 13 at the time of pressing. As such, in the step S15 of pressing, removing excessive binder resin using the sheet Pc1 at the time of hardening the electrically-conductive member 13 allows for reducing via resistance. The sheet Pc1 for use in the example herein preferably has a thickness L12 that is determined in consideration of the thickness of the electrically-conductive member 13 across two vias 16 on the wiring pad 18.

As shown in FIG. 11B, in the step S15 of pressing, pressing may be performed using a heating platen HL11 that is a metal mold having protrusions Dp forming a recess-and-protrusion pattern inverted with respect to a recess-and-protrusion pattern including recesses each formed between a surface of a respective wiring pad 18 and a surface of the first covering layer 12. The protrusions Dp include first protrusions Dp1 each corresponding to a respective one of the openings H and second protrusions Dp2 each corresponding to a portion without wirings such as the wiring pads 18. The first protrusions Dp1 have a length L21 and a protrusion height L22 that are similar to the length L1 and the hole depth L2 of respective openings H in a plan view. The first protrusions Dp1 have the height L22 that is determined in consideration of a thickness of the electrically-conductive member 13 across two vias 16 on each wiring pad 18.

The second protrusion Dp2 has a height L23 that allows for protruding by the thickness of the wirings such as the wiring pad 18. The second protrusion Dp2 is formed with an inverted protrusion pattern with respect to the protrusion pattern in which the protrusions from the base member 11 on a surface covered by the first covering layer 12 are formed by the first wiring layer 17 such as the wiring pad 18.

By performing pressing using the metal mold having the protrusion Dp, the binder resin contained in the electrically-conductive member 13 can be extruded and removed, and an appropriate pressure can be applied to the wiring substrate 20, the adhesive layer 30, and the light-emitting modules 10.

As shown in FIGS. 11A and 11B, the wiring substrate 20 and the light-emitting modules 10 are appropriately connected through the adhesive layer 30 by pressing, so that reliability of connection can be further increased.

Next, another example of a method of manufacturing the surface-emitting light source will be described referring to FIG. 12 and FIGS. 13A to 14D. The steps that have been described above will be indicated by the same reference numeral, and repetitive descriptions thereof will be omitted as appropriate. While the wiring substrate 20 in the description below includes the second wiring layer 14 and the second covering layer 15, the wiring substrate 20 may be configured without the second wiring layer 14 and the second covering layer 15.

Figure 12:
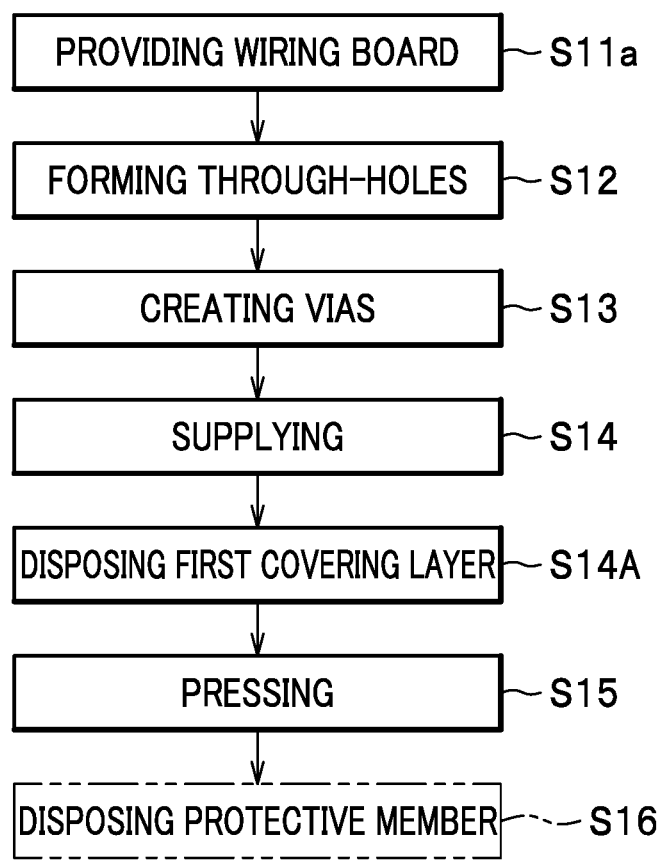
FIG. 12 is a flowchart illustrating another method of manufacturing the surface-emitting light source according to one embodiment.
Figure 13A:
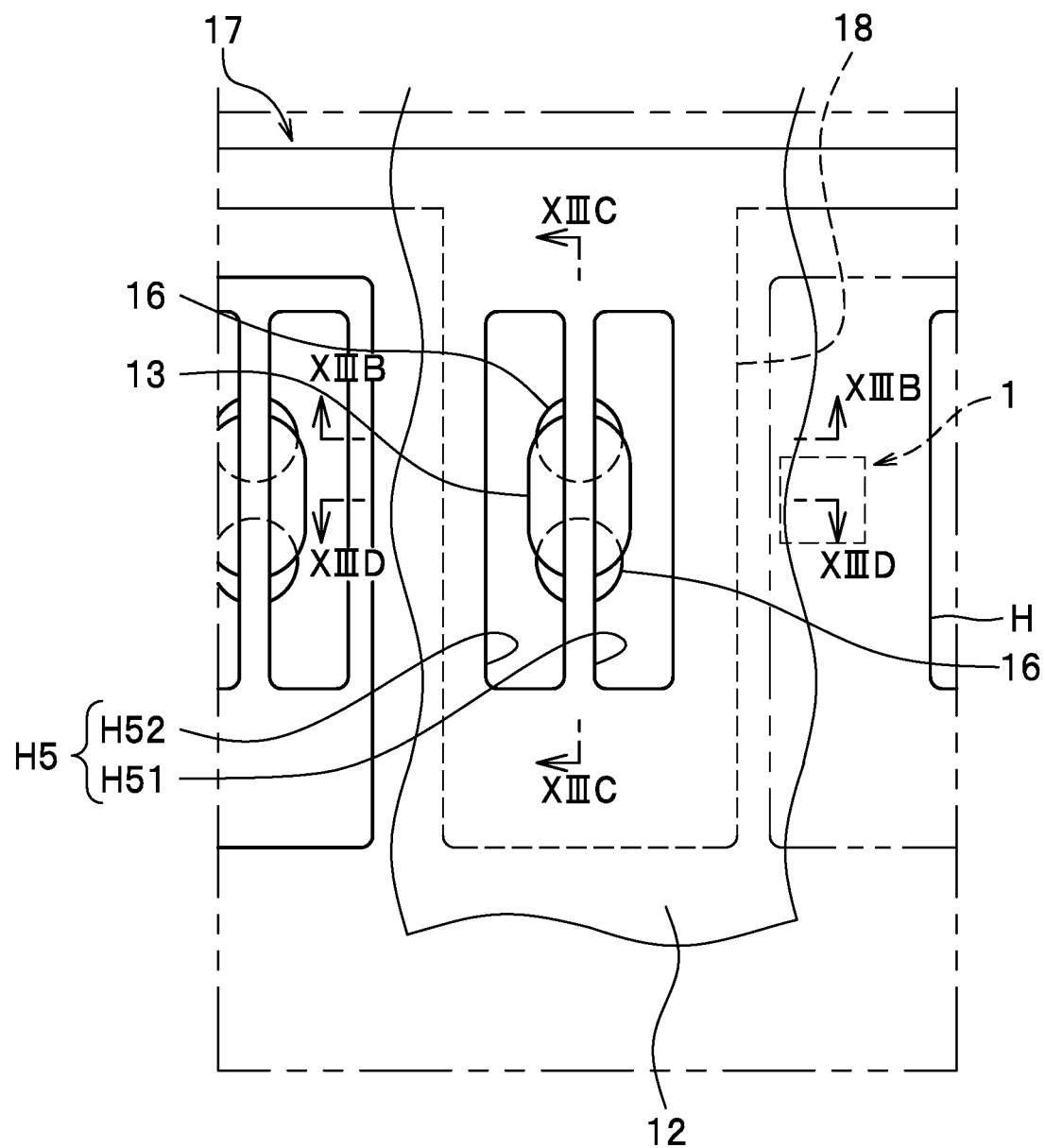
FIG. 13A is a schematic enlarged view illustrating a relationship between an opening formed in a first covering layer and a wiring pad in the another method of manufacturing the surface-emitting light source according to one embodiment.
Figure 13B:
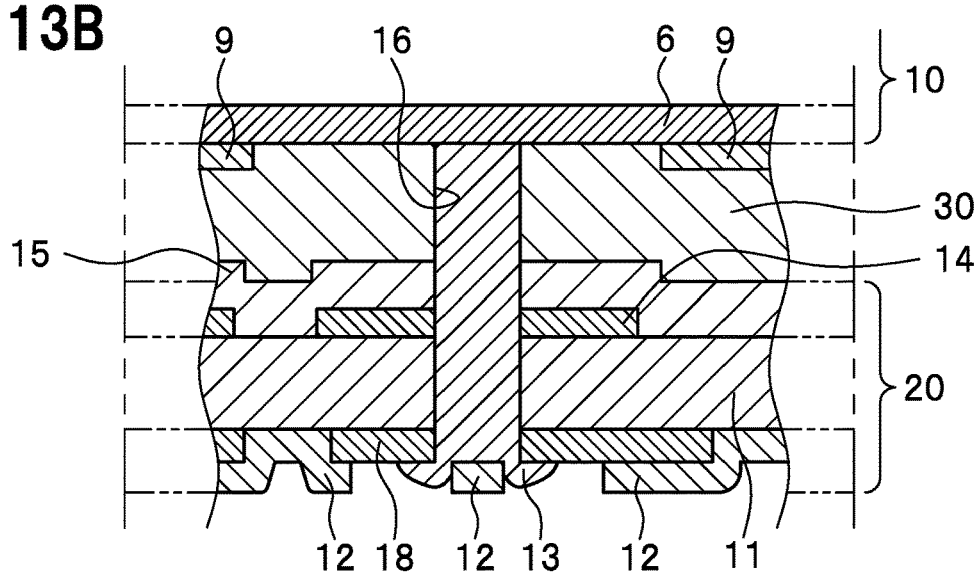
FIG. 13B is a schematic cross-sectional view taken along a line XIIIB-XIIIB of FIG. 13A.
Figure 13C:
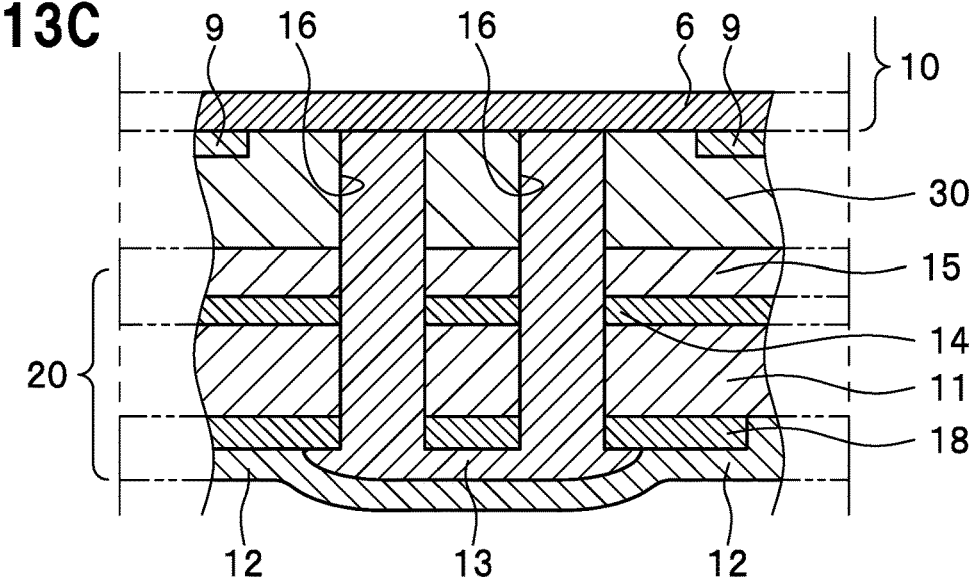
FIG. 13C is a schematic cross-sectional view taken along a line XIIIC-XIIIC of FIG. 13A.
Figure 13D:
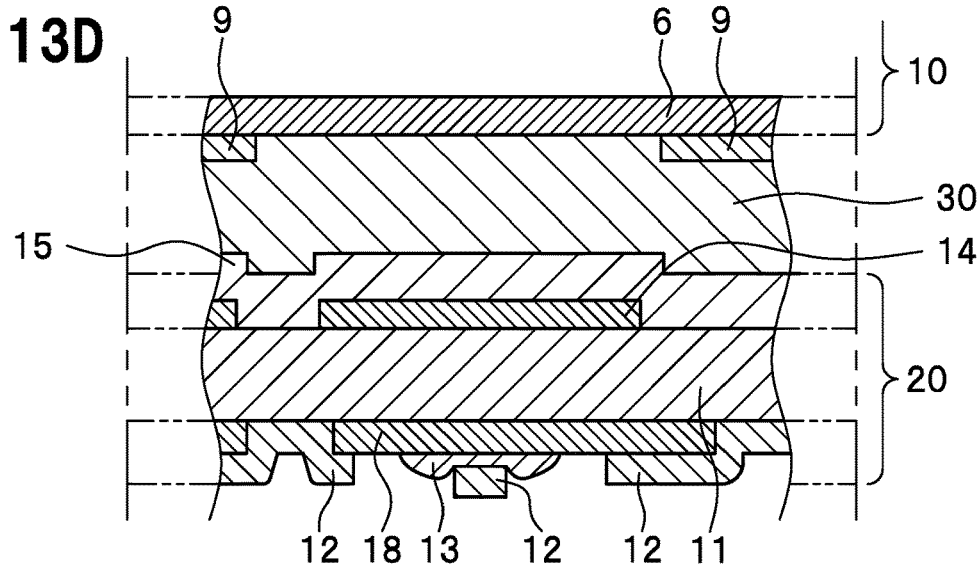
FIG. 13D is a schematic cross-sectional view taken along a line XIIID-XIIID of FIG. 13A.
Figure 14A:
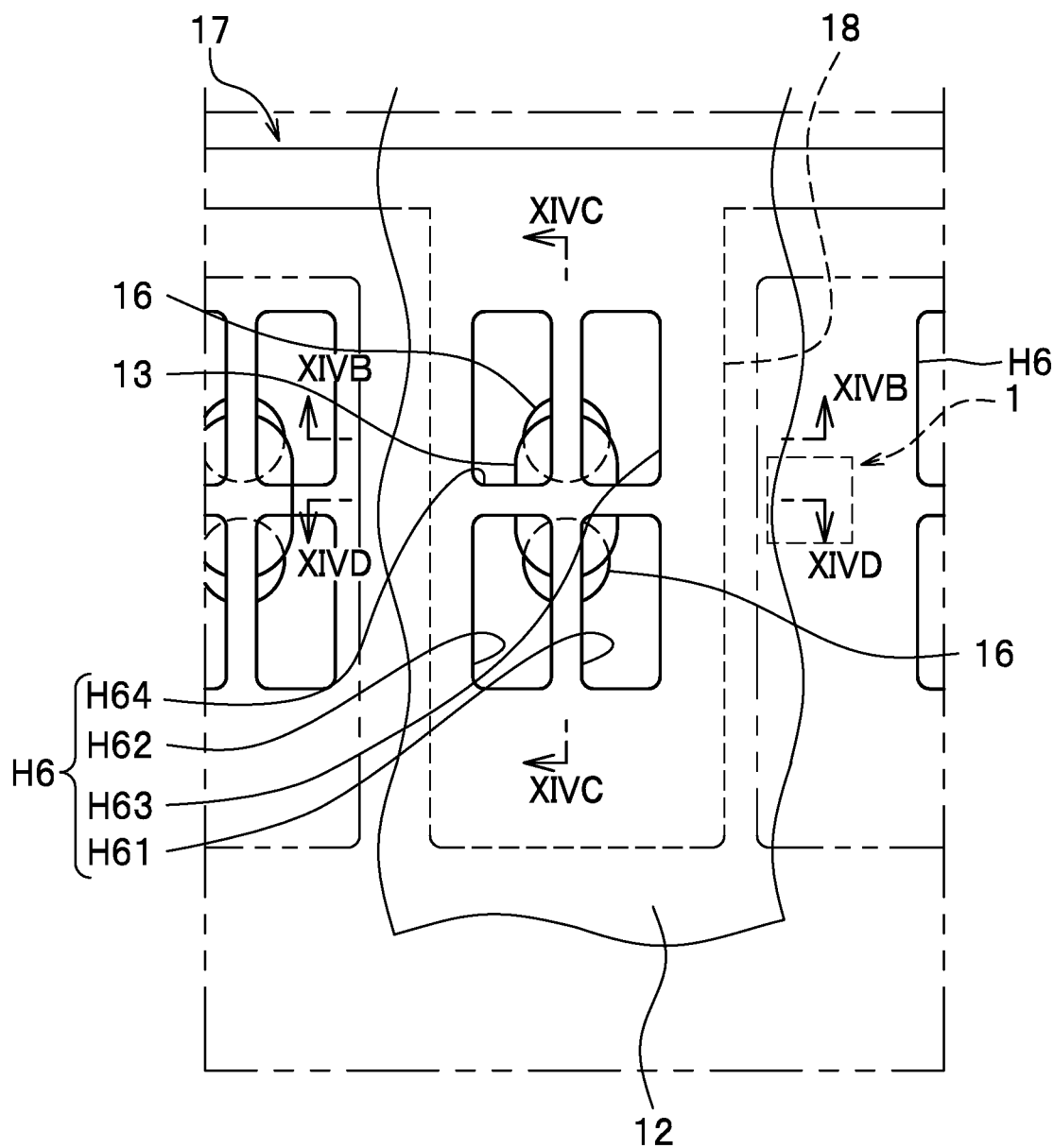
FIG. 14A is a schematic enlarged view illustrating a relationship between an opening, formed on a first covering layer, in another shape and a wiring pad in the another method of manufacturing the surface-emitting light source according to one embodiment.
Figure 14B:
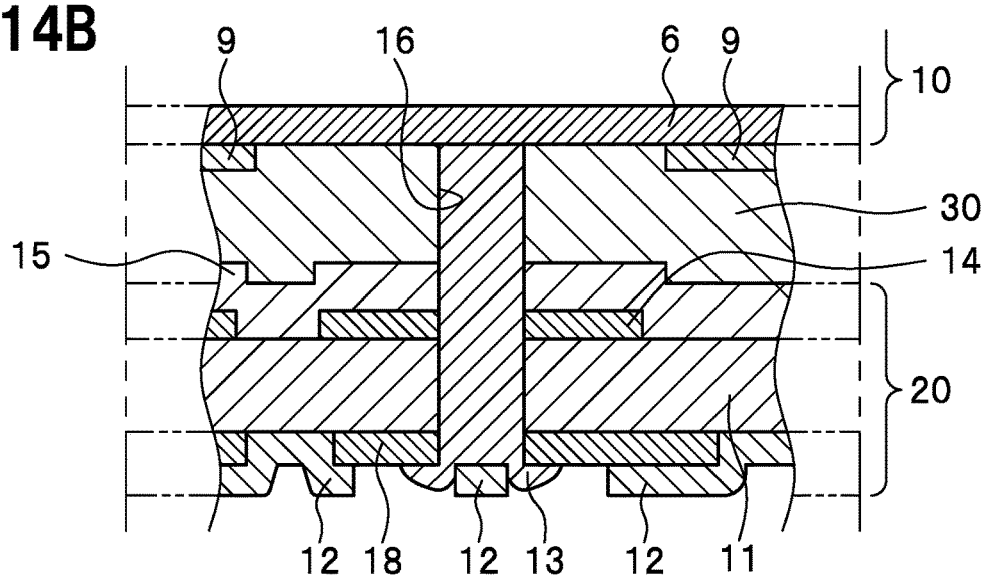
FIG. 14B is a schematic cross-sectional view taken along a line XIVB-XIVB of FIG. 14A.
Figure 14C:
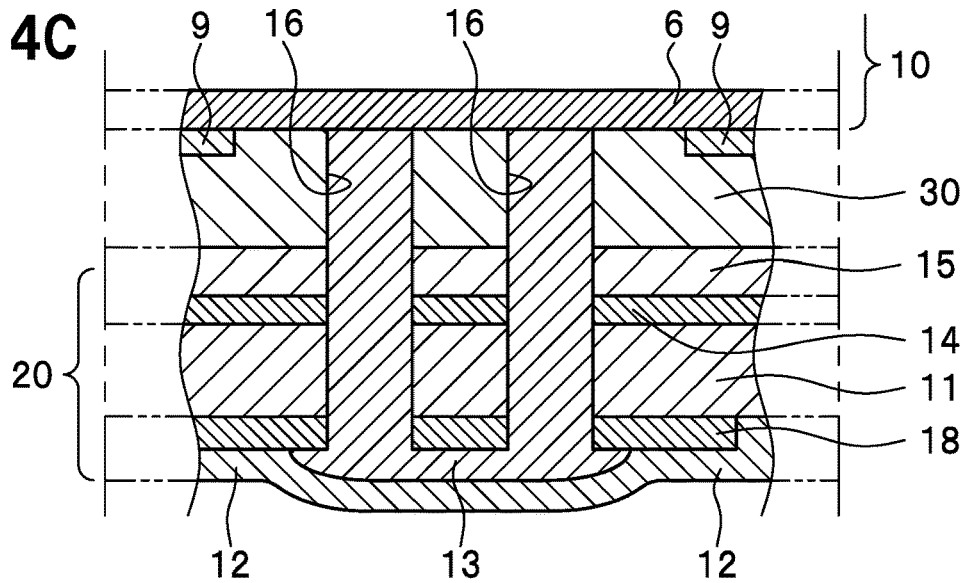
FIG. 14C is a schematic cross-sectional view taken along a line XIVC-XIVC of FIG. 14A.
Figure 14D:
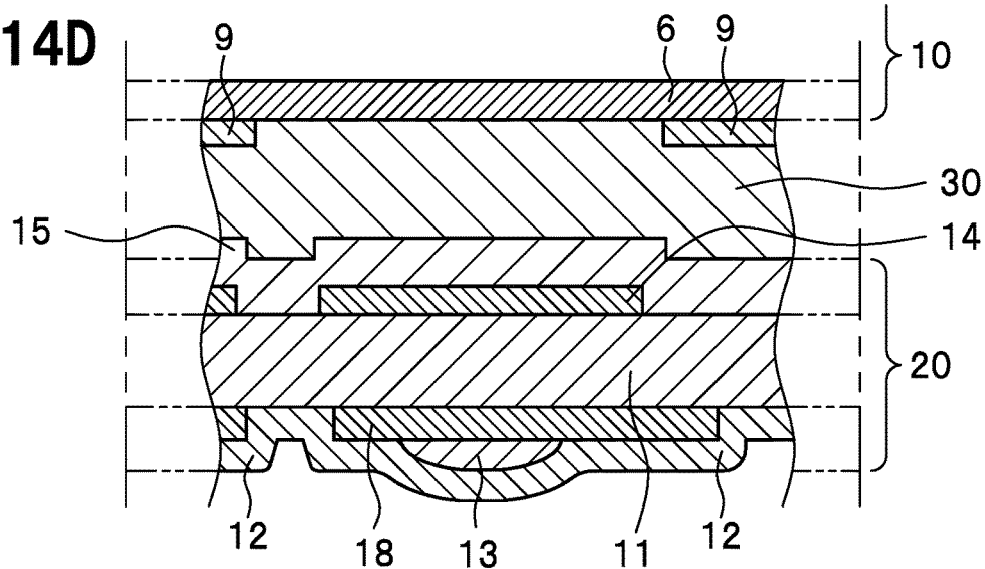
FIG. 14D is a schematic cross-sectional view taken along a line XIVD-XIVD of FIG. 14A.

The method of manufacturing the surface-emitting light source includes, as shown in FIG. 12, a step S11a of providing a wiring substrate, a step S12 of forming through-holes, a step S13 of creating vias, a step S14 of supplying, a step S14A of disposing a first covering layer, a step S15 of pressing, and a step S16 of forming a protective member, in this order.

Figure 7:
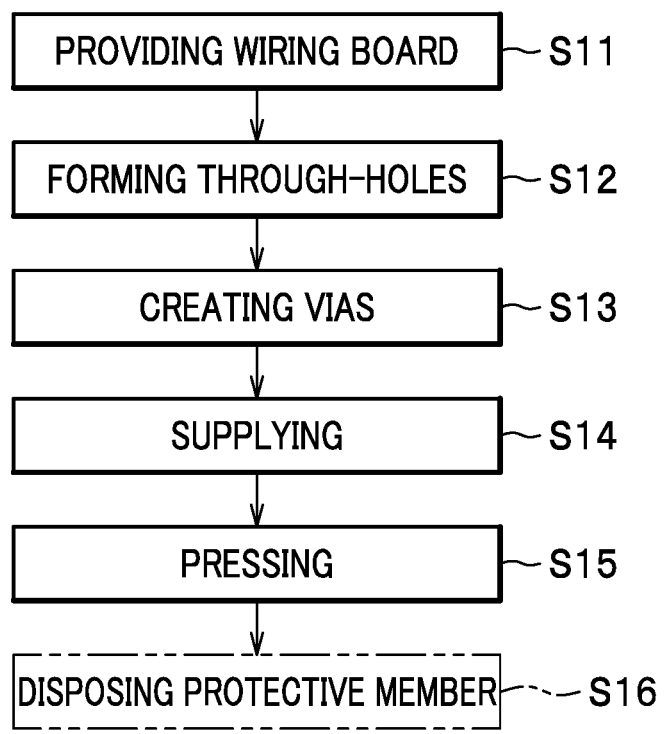
FIG. 7 is a flowchart illustrating a method of manufacturing the surface-emitting light source according to one embodiment.

The difference from the method of manufacturing shown in FIG. 7 is that the first covering layer is not disposed in the step S11a of providing a wiring substrate. The first covering layer is disposed after the step S14 of supplying.

In the step S11a of providing a wiring substrate, the first wiring layer 17 is disposed on the rear surface of the base member 11. In the step S11a of providing a wiring substrate, the first covering layer 12 to cover the first wiring layer 17 is not formed at this time. In the wiring substrate 20 to be provided in the step S11a of providing a wiring substrate, the second wiring layer 14 and the second covering layer 15 are disposed on the front surface of the base member 11.

The step S12 of forming through-holes is performed and the wiring substrate 20 and the adhesive layer 30, which is an adhesive layer, are temporarily connected, and the through-holes 160 are also formed in the wiring pad 18 of the first wiring layer 17.

Next, the step S13 of creating vias is performed, and the step S14 of supplying is performed. The step S14 of supplying is performed before the step S14A of disposing a first covering layer. This can secure connection between metal members of the electrically-conductive member 13 and the wiring pad 18.

In the step S14A of disposing a first covering layer, the first covering layer 12 is disposed on the electrically-conductive member 13 disposed inside the vias 16 and the wiring pad 18. The first covering layer 12 defines openings H5 at locations corresponding to the wiring pads 18 with an area dimension smaller than respective area dimensions of the wiring pads 18. The opening H5 have the same plan view shape as that of the opening H2 described above. The opening H5 of the first covering layer 12 is different from the configuration described above in that the first covering layer 12 is disposed on the electrically-conductive members 13 between a first rectangular opening H51 and a second rectangular opening H52 that are adjacent to each other.

After the step S14A of forming a first covering layer, a step S15 of pressing is performed. In the step S15 of pressing, pressing is performed in a manner as in any one of the manners shown in FIGS. 8E, 11A, and 11B. The electrically-conductive member 13 supplied into the vias 16 is pressed to reduce its height on the wiring pad 18, and accordingly a portion of the electrically-conductive member 13 located on the wiring pad 18 and covered by the first covering layer 12 has a height smaller than a thickness of the first covering layer 12. The first covering layer 12 is pressed in a state where the opening H5 has been formed corresponding to the wiring pad 18. With this configuration, the volatile component of the electrically-conductive member 13 is released from the opening H5.

Also, with first covering layer 12 defining the openings H5 on or above the wiring pad, the determined pressure can be appropriately applied to the wiring substrate 20 and the adhesive layer 30, and via resistance can be reduced.

Next, the step S16 of disposing a protective member is performed to dispose the protective member 19, which is an insulating resin, in the opening H5.

In the method of manufacturing a surface-emitting light source shown in FIG. 12 and FIGS. 13A to 13D, the first covering layer 12 may be disposed on the first wiring layer 17 to form an opening H6 as shown in FIGS. 14A to 14D. The opening H6 has the same plan view shape as that of the opening H3 described above. The configuration shown in FIGS. 14A to 14D is obtained through the same steps as the steps described above through which the configuration shown in FIG. 12 and FIGS. 13A to 13D is obtained except a shape of the opening H6 of the first covering layer 12.

The surface-emitting light source 100 obtained through such steps in the manufacturing method can have high reliability of connection as with the surface-emitting light source described above.

FIGS. 15A to 15E are schematic plan views each illustrating a variation of a supplied state of an electrically-conductive member shown in FIG. 4 and FIGS. 9A to 9D, respectively. FIG. 15F is a schematic plan view illustrating a variation of the opening of the covering layer and a supplied state of the electrically-conductive member. FIG. 16A is a schematic cross-sectional view taken along a line XVIA-XVIA of FIG. 15A. FIG. 16B is a schematic cross-sectional view taken along a line XVIB-XVIB of FIG. 15A.

As shown in FIGS. 15A to 15F and FIGS. 16A to 16B, the electrically-conductive member 13 may be supplied into the vias 16 in the wiring pad 18 such that the electrically-conductive member 13 includes the electrically-conductive members 13A and 13B supplied separately into respective single vias 16. The electrically-conductive members 13A and 13B are made of the same material as that of the electrically-conductive member 13 described above. Configurations that are the same as those described above are denoted by the same reference numeral, and its detailed description will be omitted.

A surface-emitting light source 100 according to these variations includes a wiring substrate 20, a plurality of light-emitting modules 10, and an adhesive layer 30 disposed between the wiring substrate 20 and a plurality of light-emitting modules 10, the wiring substrate 20 including a base member 11, a wiring layer (a first wiring layer) 17 disposed on a rear surface of the base member 11 opposite to the surface at a light-emitting modules 10 side, electrically-conductive members 13 each supplied into a corresponding one of vias 16 each formed in a corresponding one of wiring pads 18 that are portions of the wiring layer 17, a covering layer (a first covering layer) 12 covering the wiring layer 17 and defining openings H in each of which a portion of a corresponding wiring pad 18 is exposed. Each of the light-emitting modules 10 has an array of a plurality of light emitting devices 1. The first covering layer 12 defines openings H at locations corresponding to the wiring pads 18 with an area dimension smaller than respective area dimensions of the wiring pads 18 in a plan view.

Figure 4:
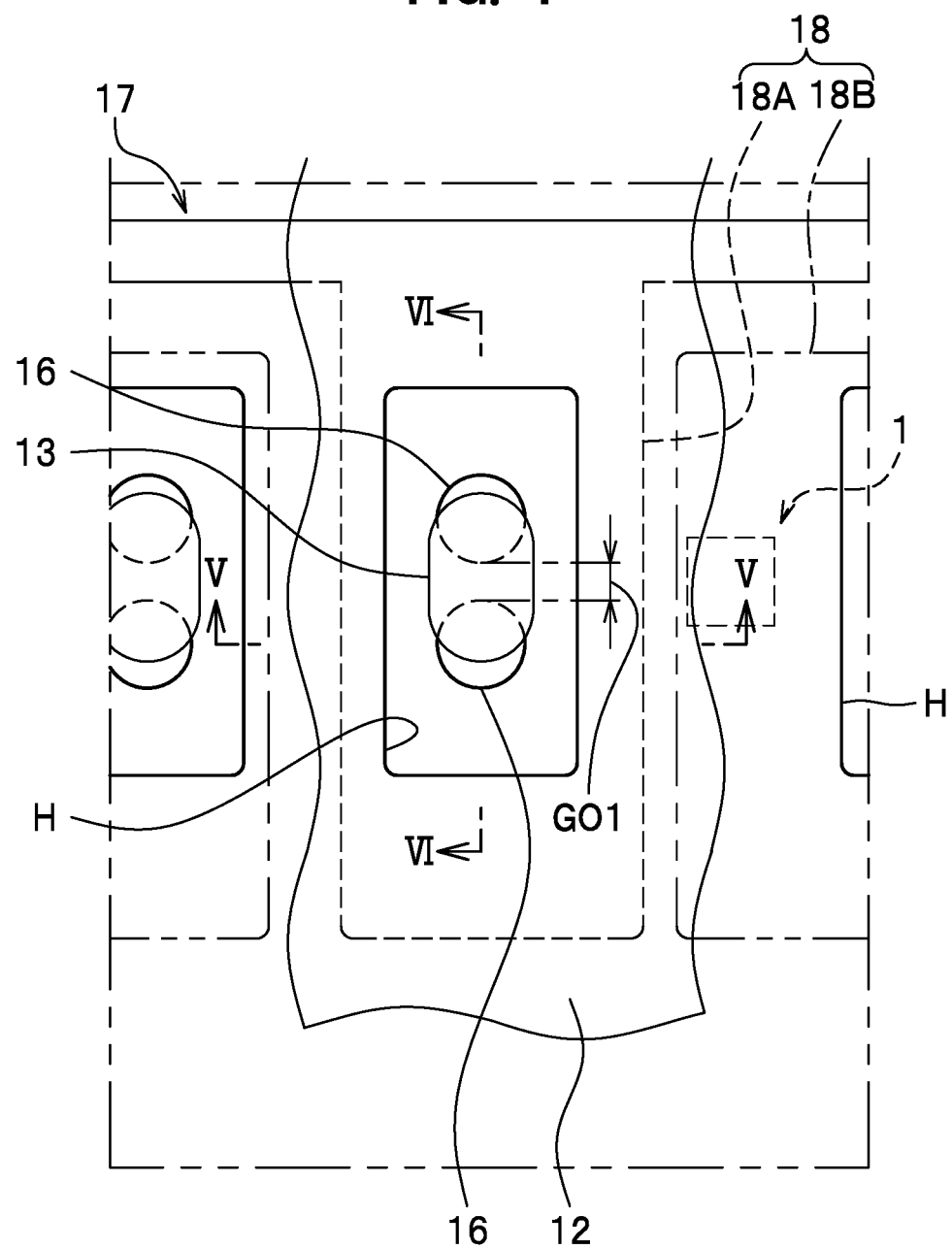
FIG. 4 is a schematic enlarged view illustrating a relationship between an opening formed in a first covering layer and a wiring pad of the surface-emitting light source according to one embodiment.
Figure 5:
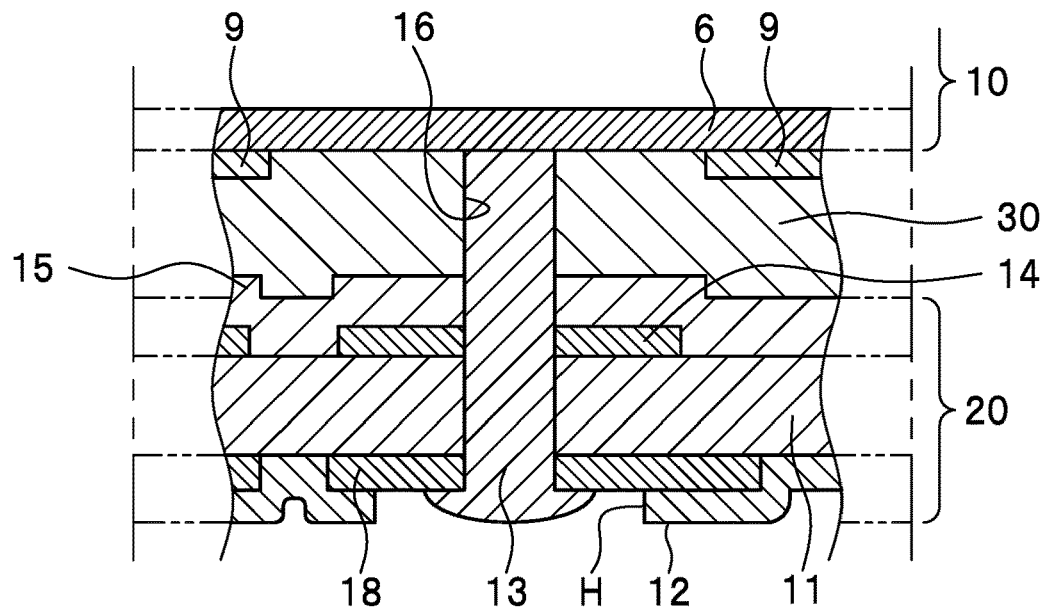
FIG. 5 is a schematic cross-sectional view taken along a line V-V of FIG. 4.
Figure 6:
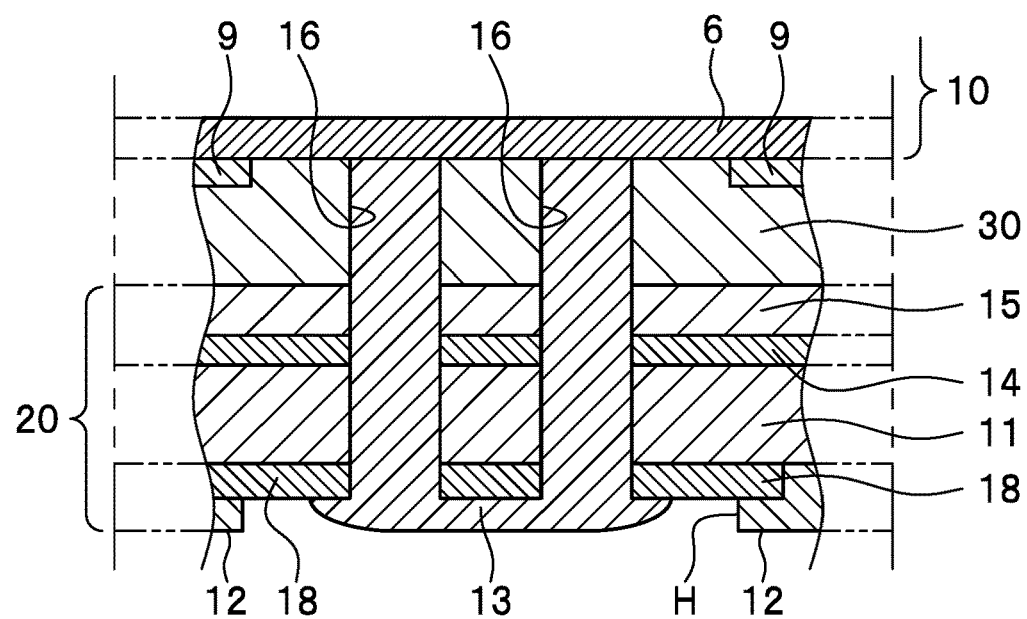
FIG. 6 is a schematic cross-sectional view taken along a line VI-VI of FIG. 5.
Figure 15A:
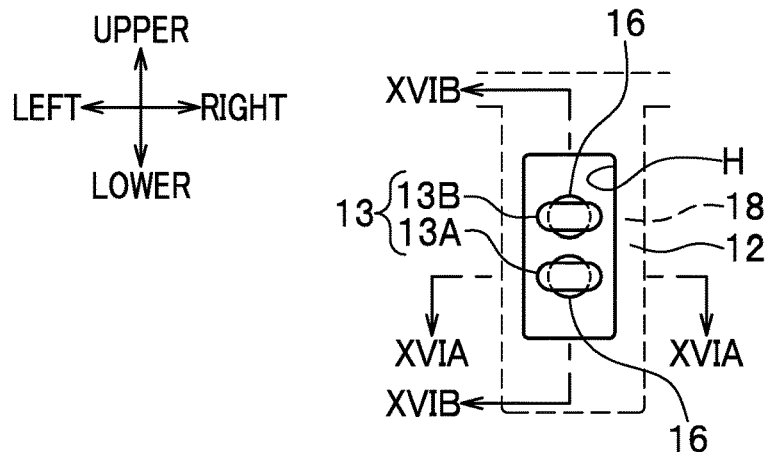
FIG. 15A is a schematic plan view illustrating a first variation of supplied state of the electrically-conductive member, which is a variation of the supplied state of the electrically-conductive member in FIG. 4.
Figure 16A:
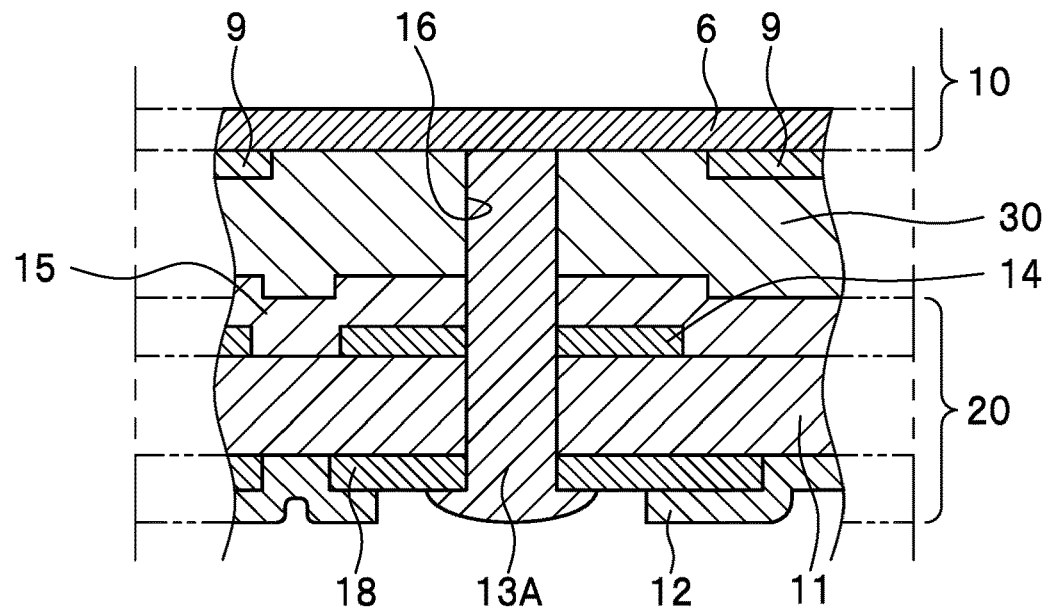
FIG. 16A is a schematic cross-sectional view taken along a line XVIA-XVIA of FIG. 15A.
Figure 16B:
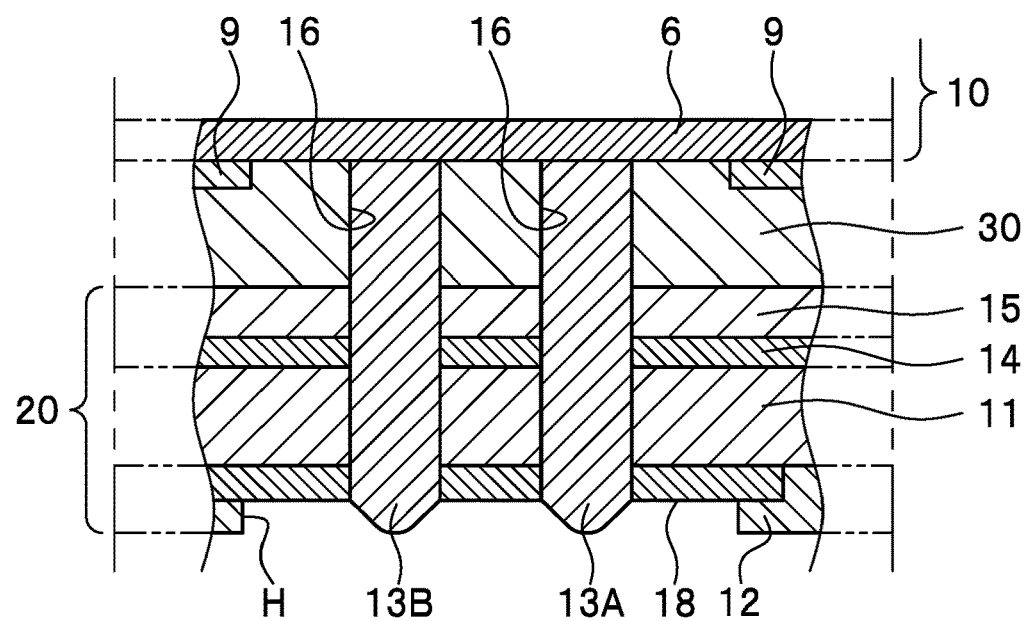
FIG. 16B is a schematic cross-sectional view taken along a line XVIB-XVIB of FIG. 15A.

For example, as shown in FIG. 15A, when two vias 16 are formed in the wiring pad 18 as described referring mainly to FIG. 4 and a single opening H is formed with an area dimension smaller than the area dimension of the corresponding wiring pad 18 in a plan view, the electrically-conductive members 13A and 13B may be formed to be supplied into respective ones of vias 16.

The electrically-conductive members 13A and 13B inside the opening H have a height smaller than a height of the first covering layer 12. The electrically-conductive members 13A and 13B are disposed to extend to portions around the vias 16 in the direction (the lateral direction in FIG. 15A) different from the direction of a straight line along which two vias 16 are arrayed such that the electrically-conductive members 13A and 13B are in contact with portions of the front surface of the wiring pad 18. Supplying the electrically-conductive members 13A and 13B separately into the plurality of vias 16 can be performed using, for example, screen printing through a mask.

Figure 15B:
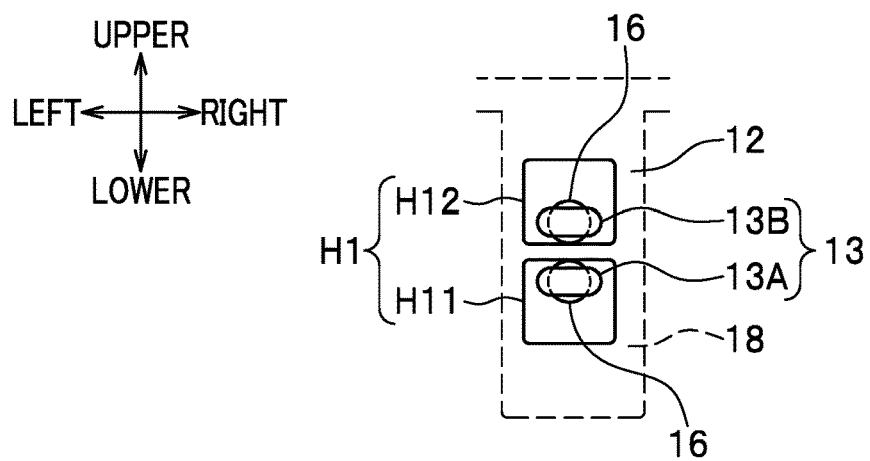
FIG. 15B is a schematic plan view illustrating a second variation of supplied state of the electrically-conductive member, which is a variation of the supplied state of the electrically-conductive member in FIG. 9A.

As shown in FIG. 15B, in the configuration in FIG. 9A described above, the electrically-conductive members 13 may be supplied into respective ones of the vias 16 in respective ones of a first rectangular opening H11 and a second rectangular opening H12 to be separate from each other. In each electrically-conductive member 13, a portion of the first covering layer 12 between the first rectangular opening H11 and the second rectangular opening H12 forms a step, and each of the first rectangular openings H11 and H12 is formed for a respective one of vias 16, which facilitates demarcation.

Figure 15C:
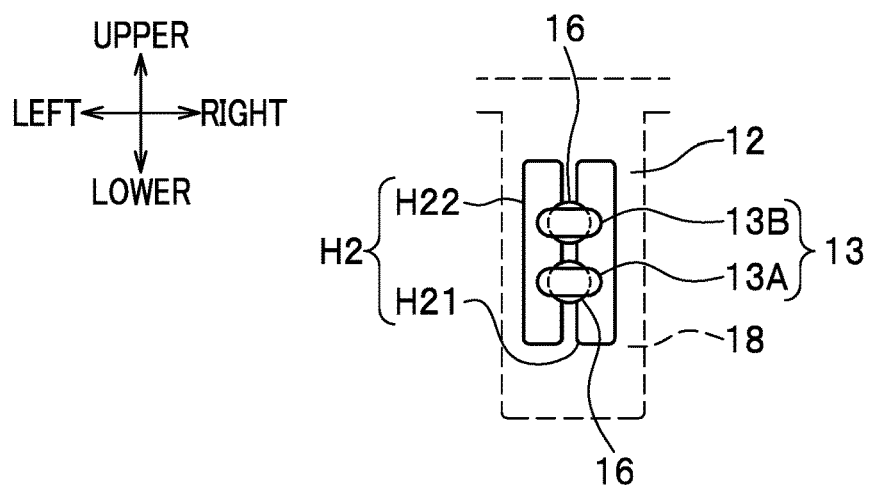
FIG. 15C is a schematic plan view illustrating a third variation of supplied state of the electrically-conductive member, which is a variation of the supplied state of the electrically-conductive member in FIG. 9B.

Further, as shown in FIG. 15C, in the configuration in FIG. 9B described above, the electrically-conductive members 13 may be supplied into respective vias 16 formed across a first rectangular opening H21 and a second rectangular opening H22 to be separate from each other. In the electrically-conductive member 13, a portion of the first covering layer 12 between the first rectangular opening H21 and the second rectangular opening H22 forms a step, which facilitates demarcation.

Figure 15D:
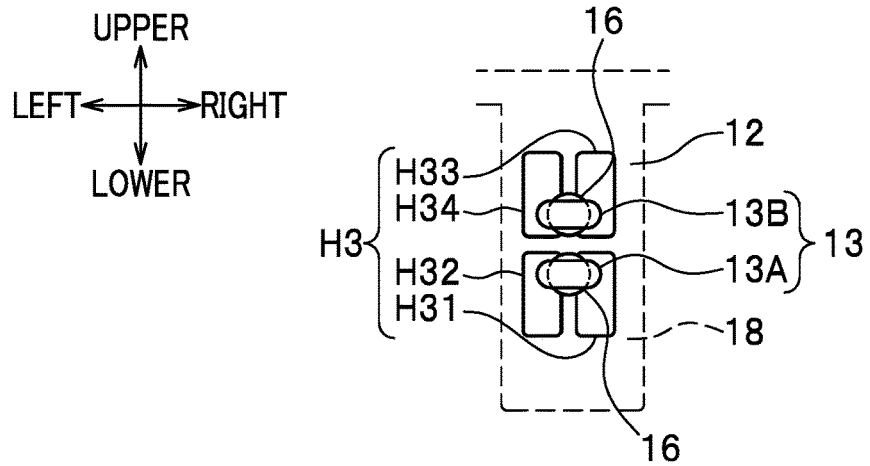
FIG. 15D is a schematic plan view illustrating a fourth variation of supplied state of the electrically-conductive member, which is a variation of the supplied state of the electrically-conductive member in FIG. 9C.

As shown in FIG. 15D, in the configuration in FIG. 9C, the electrically-conductive members 13 may be supplied into a respective vias 16, each formed across corresponding ones of a first rectangular opening H31, a second rectangular opening H32, a third rectangular opening H33, and a fourth rectangular opening H34. In the example herein, one of the electrically-conductive members 13 is supplied to a single via 16 across the first rectangular opening 31 and the second rectangular opening 32. The other of the electrically-conductive members 13 is supplied to another single via 16 across the third rectangular opening H33 and the fourth rectangular opening H34.

Figure 15E:
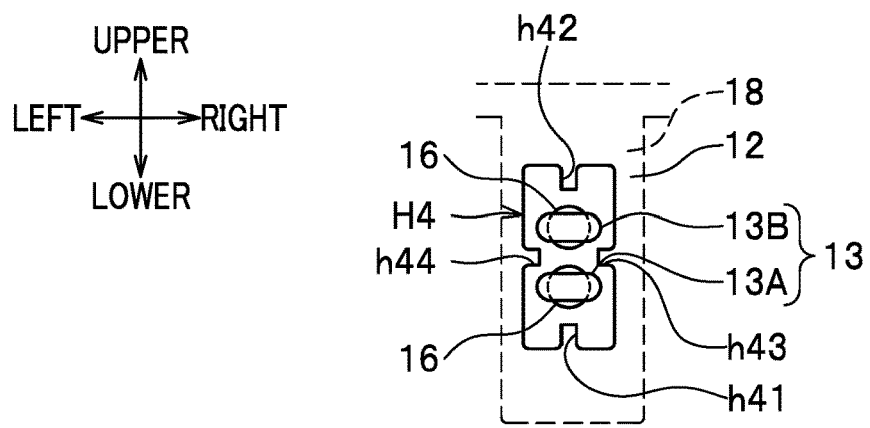
FIG. 15E is a schematic plan view illustrating a fifth variation of supplied state of the electrically-conductive member, which is a variation of the supplied state of the electrically-conductive member in FIG. 9D.
Figure 15F:
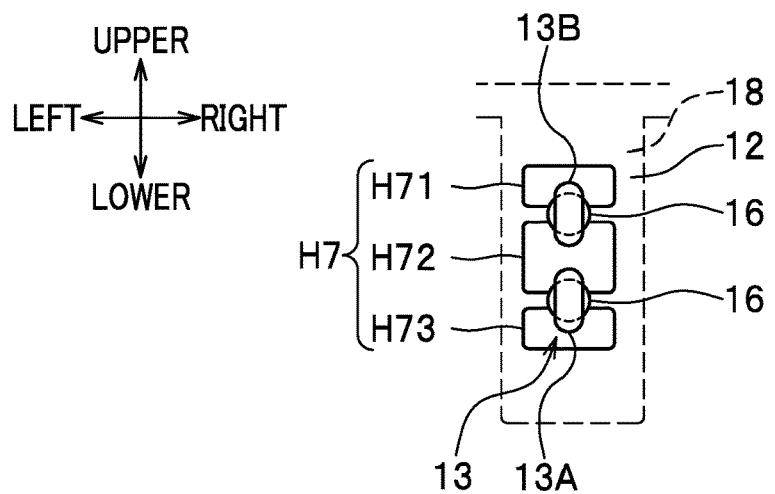
FIG. 15F is a schematic plan view illustrating a sixth variation of openings of a covering layer and supplied state of the electrically-conductive member.

As shown in FIG. 15E, in the configuration in FIG. 9D, the electrically-conductive members 13 may be supplied into one of the vias 16 and the other of the vias 16 inside the opening H4 to be separate from each other.

The electrically-conductive members 13A and 13B shown in FIG. 15A have a cross-sectional shape of, as shown in FIG. 16B, a curved convex shape toward a side opposite to a side at which the light-emitting module 10 is disposed such that portions of the electrically-conductive members 13A and 13B exposed from the wiring pad 18 is disposed at intervals in a direction of a straight line along which the vias 16 are arrayed (the vertical direction in FIG. 15A). In the direction orthogonal to the direction of a straight line along which the vias 16 are arrayed (the lateral direction in FIG. 15A), a portion of the electrically-conductive members 13A and 13B exposed from the wiring pad 18 and including a portion in contact with the wiring pad 18 around the via 16 have a cross-sectional shape of a elliptic sector shape with a portion in contact with a pad electrode in the via 16 being pressed, as shown in FIG. 16A.

Cross-sectional shapes of each of configurations shown in FIGS. 15B to 15E are almost the same as the cross-sectional shapes in FIGS. 16A and 16B of a configuration shown in FIG. 15A.

Further, as shown in FIG. 15F, an opening H7 formed in the first covering layer 12 includes a first rectangular opening H71, a second rectangular opening H72, and a third rectangular opening H73. The openings H7 corresponding to each wiring pad 18 have a total area dimension that is smaller than the area dimension of the wiring pad 18 in a plan view. The first rectangular opening H71, the second rectangular opening H72, and the third rectangular opening H73 are aligned along a line. The second rectangular opening H72 disposed at the center of the first to three rectangular openings H71 to H73 has a larger area dimension than the area dimension of the first rectangular opening H71 or the third rectangular opening H73 disposed upward or downward in FIG. 15F. The vias 16 are formed such that one of the vias 16 (a first via 16) is formed across the first rectangular opening H71 and the second rectangular opening H72, and the other of the vias 16 (a second via 16) is formed across the second rectangular opening H72 and the third rectangular opening H73.

The electrically-conductive member 13A is supplied to one via 16 (the first via 16) such that the electrically-conductive member 13A is filled in the vias 16 and further extends across the second rectangular opening H72 and the third rectangular opening H73. The electrically-conductive member 13B is supplied into the other via 16 (the second via 16) such that the electrically-conductive member 13B is filled in the vias 16 and further extends across the first rectangular opening H71 and the second rectangular opening H72. The electrically-conductive member 13A and the electrically-conductive member 13B are disposed with a gap between each other in the second rectangular opening H72. As described above, along a direction in which the first rectangular opening H71 to the third rectangular opening H73 are arrayed along a single line (the vertical direction in FIG. 15F), an upper portion of each of the electrically-conductive members 13A and 13B that is exposed outward has a shape elongated along the vertical direction in FIG. 15F. For example, moving the squeegee in the vertical direction of FIG. 15F through the mask for screen printing when the electrically-conductive material 13 is supplied into the vias 16 allows for forming the electrically-conductive members 13A and 13B.

The electrically-conductive members 13A and 13B shown in FIG. 15F have substantially the same shapes as the electrically-conductive members 13A and 13B, respectively, shown in FIG. 15A except that the cross-sectional shape of a portion exposed from the wiring pad 18 differs in orientation.

In configurations shown in FIGS. 15A to 15F, electrical connection is secured at a contact portion between the wiring pad 18 and the electrically-conductive members 13A and 13B. Accordingly, in the case in which the first covering layer 12 overlaps an opening periphery of the via 16, the overlapping ratio of the first covering layer 12 to the opening periphery of the via 16 is preferably 30% or less of the total opening periphery of the via 16. As long as the wiring pad 18 and the electrically-conductive member 13 are electrically connected through a contact portion, the electrically-conductive member 13 may have any appropriate plan view shape.

As described above, in the surface-emitting light source 100 and the method of manufacturing the same, the first covering layer 12 defines the openings H and H1 to H7 on or above the wiring pads 18. This configuration allows for greatly reducing portions to which pressure applied in the pressing is less easily transmitted, so that insufficient adhesion can be avoided. Also, in the manufacturing method, pressure is applied inside the openings H and H1 to H7 using the sheet Pc1 or the protrusion Dp of the metal mold. This allows for removing an excessive binder resin contained in the electrically-conductive member 13, so that via resistance can be reduced.

While the openings H and H1 to H7 in the description above have mainly a rectangular shape, the openings H and H1 to H7 may have another shape such as a round hole opening. Any appropriate number and any appropriate shape of vias 16 may be formed in the wiring pad 18.

In the surface-emitting light source 100, the wiring substrate 20 including the first wiring layer 17 and the first covering layer 12 that are on only the rear surface of the base member 11 as shown in FIG. 10 described above may be used.

In the surface-emitting light source and the method of manufacturing the surface-emitting light source, the first covering layer 12 may be formed at the time of either the step shown in FIG. 7 or the step shown in FIG. 12. The openings defined in the first covering layer 12 corresponding to the wiring pads may have any appropriate shape and size, as long as the opening in the first covering layer 12 has an area dimension that is smaller than the area dimension of the wiring pad in a plan view and overlaps at least a portion of the via.

That is, various modifications of the surface-emitting light source may be made within the scope of the claims. Also, the method of manufacturing a surface light source device may include another step between the steps described above or before or after the steps described above.

While certain embodiments of the surface-emitting light source and the method of manufacturing a surface light source device have been described above, the present invention is not limited the description above, and should be broadly construed on the basis of the claims. The present invention also encompasses variations and modifications that are made on the basis of the description above.

What is claimed is:

1. A surface-emitting light source comprising:
   a plurality of light-emitting modules;
   a wiring substrate including:
      a base member having a front surface at a light-emitting modules side and a rear surface opposite to the front surface at the light-emitting modules side,
      a wiring layer disposed on the rear surface of the base member and including wiring pads which are portions of the wiring layer,
      electrically-conductive members each supplied across corresponding two or more of a plurality of vias, the plurality of vias formed in each of the wiring pads, and
      a covering layer covering the wiring layer and defining pad openings in each of which a portion of a corresponding one of the wiring pads is exposed; and
   an adhesive layer between the plurality of light-emitting modules and the wiring substrate;
   wherein each of the light-emitting modules includes an array of a plurality of light emitting devices, and
   wherein the covering layer defines the pad openings at locations corresponding to the wiring pads with an area dimension smaller than respective area dimensions of the wiring pads in a plan view.

2. The surface-emitting light source according to claim 1, wherein each of the pad openings in the covering layer has a size that allows the plurality of vias formed in each of the wiring pads to be exposed in a single opening of the covering layer.

3. The surface-emitting light source according to claim 1, wherein each of the pad openings in the covering layer are formed for a respective one of the vias.

4. The surface-emitting light source according to claim 1, wherein,
   a plurality of adjacent openings, adjacent to each other, of the pad openings in the covering layer are formed for respective single vias of the plurality of vias such that a portion of each of the plurality of adjacent openings, which is a periphery of a portion of the covering layer, meets a portion of an outer periphery of a respective one of the plurality of vias.

5. The surface-emitting light source according to claim 1, wherein each of the pad openings has a bilaterally symmetric shape with respect to the center of a corresponding one of the vias.

6. The surface-emitting light source according to claim 1,
   wherein at least one of the pad openings comprises a first rectangular opening and a second rectangular opening for each of the wiring pads,
   wherein a portion of the first rectangular opening overlaps across the plurality of vias at one side with respect to centers of the vias,
   wherein a portion of the second rectangular opening overlaps across the plurality of vias at another side with respect to the centers of the vias, and
   wherein the first rectangular opening and the second rectangular opening are disposed adjacent to each other through a corresponding portion of the covering layer and portions of the vias.

7. The surface-emitting light source according to claim 1, wherein at least one of the pad openings comprises the first rectangular opening and the second rectangular opening for each of the wiring pads, the first rectangular opening and the second rectangular opening being formed adjacent to each other for respective single vias of the vias.

8. The surface-emitting light source according to claim 7,
   wherein, the via in the first rectangular opening is located offset from a center of the first rectangular opening toward one side,
   wherein the via in the second rectangular opening is located offset from a center of the second rectangular opening toward another side, and
   wherein the first rectangular opening and the second rectangular opening are formed adjacent to each other through the covering layer.

9. The surface-emitting light source according to claim 1,
wherein at least one of the openings comprises a first rectangular opening, a second rectangular opening, a third rectangular opening, and a fourth rectangular opening for each of the wiring pads,
wherein the first rectangular opening and the second rectangular opening are formed adjacent to each other to overlap a portion of one of the vias,
wherein the third rectangular opening and the fourth rectangular opening are formed adjacent to each other to overlap a portion of another of the vias,
wherein the first rectangular opening and the third rectangular opening are disposed adjacent to each other through a corresponding portion of the covering layer, and
wherein the second rectangular opening and the fourth rectangular opening are disposed adjacent to each other through a corresponding portion of the covering layer.

10. The surface-emitting light source according to claim 1, wherein a protective member is disposed to cover the electrically-conductive members.

11. The surface-emitting light source according to claim 1, wherein the wiring layer is disposed on the front surface of the base member.

12. The surface-emitting light source according to claim 1, wherein the adhesive layer has an elasticity lower than an elasticity of the base member.

13. The surface-emitting light source according to claim 1,
wherein the base member has an elasticity of 2 Gpa or more and 5 Gpa or less, and
wherein the adhesive layer has an elasticity of 100 Mpa or more and 1 Gpa or less.

14. A method of manufacturing the surface-emitting light source according to claim 1, the method comprising:
providing a wiring substrate, the wiring substrate including
a base member having a front surface and a rear surface opposite to the front surface,
a wiring layer disposed on the rear surface of the base member and including wiring pads which are portions of the wiring layer, and
a covering layer covering the wiring layer to define pad openings in each of which a portion of a corresponding one of the wiring pads is exposed, such that the covering layer defines the pad openings at locations corresponding to the wiring pads with an area dimension smaller than respective area dimensions of the wiring pads in a plan view;
disposing an adhesive layer on the front surface side of the base member and forming through-holes in the wiring pad through the opening to extend through the wiring substrate and the adhesive layer;
temporarily connecting a plurality of light emitting modules each having an array of a plurality of light emitting devices to the front surface side of the base member, covering openings of the plurality of through holes formed in the front surface side of the base member by the plurality of light emitting devices, creating a plurality of vias from the plurality of through holes;
supplying an electrically-conductive material into the vias; and
pressing and heating to obtain an electrically-conductive member and to bond the wiring substrate and the light-emitting modules through the adhesive layer.

15. The method of manufacturing the surface-emitting light source according to claim 14, wherein the step of pressing is performed using a metal mold through a sheet having a size that is the same as a size of the openings in a plan view and having a thickness equal to a depth of the openings.

16. The method of manufacturing the surface-emitting light source according to claim 14, wherein the step of pressing is performed using a metal mold having protrusions forming a recess-and-protrusion pattern inverted with respect to a recess-and-protrusion pattern including recesses each formed between a surface of a corresponding one of the wiring pads and a surface of the covering layer.

17. The method of manufacturing the surface-emitting light source according to claim 14, the method further comprising, after pressing, disposing a protective member to cover the electrically-conductive members from one surface side of the wiring substrate.

18. The method of manufacturing the surface-emitting light source according to claim 14, wherein in the step of supplying, the electrically-conductive material is screen-printed.

19. The method of manufacturing the surface-emitting light source according to claim 14, wherein an additional wiring layer is disposed on the front surface of the base member.

20. A surface-emitting light source, comprising:
a plurality of light-emitting modules;
a wiring substrate including:
a base member having a front surface at a light-emitting modules side and a rear surface opposite to the front surface at the light-emitting modules side,
a wiring layer disposed on the rear surface of the base member and including wiring pads as portions of the wiring layer,
electrically-conductive members each supplied into a respective one of vias each formed in a corresponding one of the wiring pads, and
a covering layer covering the wiring layer and defining pad openings in each of which a portion of a corresponding one of the wiring pads is exposed; and
an adhesive layer between the wiring substrate and the plurality of light-emitting modules,
wherein each of the light-emitting modules includes an array of a plurality of light-emitting devices, and
wherein the covering layer defines the openings at locations corresponding to the wiring pads with an area dimension smaller than respective area dimensions of the wiring pads in a plan view.

* * * * *